(12) United States Patent
Henry et al.

(10) Patent No.: US 11,907,016 B2
(45) Date of Patent: Feb. 20, 2024

(54) ELECTRONIC DEVICE

(71) Applicant: Apple Inc., Cupertino, CA (US)

(72) Inventors: Thomas O. Henry, San Francisco, CA (US); Trevor M. Cardiff, Los Altos Hills, CA (US); Jason A. U. De Souza, Burlingame, CA (US); Sayooj R. Pillai, Santa Clara, CA (US); Jason Bakhshi, San Francisco, CA (US); Erik A. Uttermann, San Francisco, CA (US); Wei Lv, San Jose, CA (US); Wenyong Zhu, Saratoga, CA (US); Lee B. Hamstra, Menlo Park, CA (US); Daniel J. Hoff, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/234,306

(22) Filed: Apr. 19, 2021

(65) Prior Publication Data
US 2022/0291717 A1 Sep. 15, 2022

Related U.S. Application Data

(60) Provisional application No. 63/160,684, filed on Mar. 12, 2021.

(51) Int. Cl.
G06F 1/16 (2006.01)
G06F 1/18 (2006.01)
H05K 5/02 (2006.01)
H05K 5/03 (2006.01)

(52) U.S. Cl.
CPC .......... *G06F 1/1652* (2013.01); *G06F 1/1637* (2013.01); *G06F 1/1684* (2013.01); *G06F 1/181* (2013.01); *G06F 1/183* (2013.01); *H05K 5/0217* (2013.01); *H05K 5/0247* (2013.01); *H05K 5/03* (2013.01)

(58) Field of Classification Search
CPC ....... G06F 1/1652; G06F 1/1684; G06F 1/183
See application file for complete search history.

(56) References Cited

U.S. PATENT DOCUMENTS

| 5,946,061 | A | 8/1999 | Kurihara et al. |
| 6,741,298 | B1 | 5/2004 | Won |
| 8,199,477 | B2 | 6/2012 | Mathew et al. |
| 9,972,459 | B1* | 5/2018 | Hill ........................ H01H 13/84 |
| 10,932,380 | B2 | 2/2021 | Huston et al. |

(Continued)

FOREIGN PATENT DOCUMENTS

| CN | 101907791 A | * 12/2010 | ................ G02F 1/13 |
| CN | 102966887 A | * 3/2013 | ......... G02F 1/13357 |
| DE | 112018004941 T5 | * 7/2020 | ............ G01J 1/0425 |

Primary Examiner — Towfiq Elahi
(74) Attorney, Agent, or Firm — Dorsey & Whitney LLP

(57) ABSTRACT

A portable electronic device can include a housing defining an aperture and a display positioned in the aperture. The portable electronic device can include a number of components that can provide desired functionalities and levels of performance. For example, the device can include one or more couplers that interconnect various portions of the housing together. Additionally or alternatively, the portable electronic device can include one or more millimeter-wave antennas. Additionally, or alternatively, the electronic device can include one or more grounding elements or layers that reliably and electrically ground the display to the housing.

20 Claims, 17 Drawing Sheets

(56) References Cited

U.S. PATENT DOCUMENTS

| | | | |
|---|---|---|---|
| 11,402,866 B2 | 8/2022 | Hao et al. | |
| 2004/0200699 A1* | 10/2004 | Matsumoto | H01H 25/041 |
| | | | 200/1 B |
| 2009/0316341 A1 | 12/2009 | Huang | |
| 2011/0116217 A1 | 5/2011 | Lee et al. | |
| 2011/0260612 A1 | 10/2011 | Lee | |
| 2013/0141856 A1 | 6/2013 | Yu | |
| 2014/0062274 A1 | 3/2014 | Hirasawa | |
| 2014/0071081 A1* | 3/2014 | Shedletsky | G06F 1/18 |
| | | | 361/767 |
| 2019/0301744 A1 | 10/2019 | Yang | |
| 2019/0327865 A1* | 10/2019 | Dunn | G02F 1/133308 |
| 2021/0013082 A1 | 1/2021 | Hidaka et al. | |

\* cited by examiner

ELECTRONIC DEVICE

CROSS-REFERENCE TO RELATED APPLICATION(S)

This claims priority to U.S. Provisional Patent Application No. 63/160,684, filed 12 Mar. 2021, and entitled "ELECTRONIC DEVICE," the entire disclosure of which is hereby incorporated by reference.

FIELD

The described embodiments relate generally to electronic devices. More particularly, the present embodiments relate to portable electronic device components, systems, and architectures.

BACKGROUND

Electronic devices are widespread in society and can take a variety of forms, from wristwatches to computers. Electronic devices, including portable electronic devices such as handheld phones, tablet computers, and watches, generally include a type of housing or enclosure to house the internal components.

The components of an electronic device, for example, the processors, memory, cooling apparatuses, input components, and other components can partially determine the available functionalities and levels of performance of the electronic device. Further, the arrangement of these components and their related system with respect to one another in the device can also determine the level of performance of the electronic device.

Continued advances in electronic devices and their components have enabled considerable increases in performance as well as new uses and functionalities. Existing components and structures for electronic devices can, however, limit the levels of performance of such devices. For example, the conventional arrangement of components in an existing electronic device architecture, as well as the conventional design of the components themselves can limit the performance of an electronic device due to an inability to effectively distribute or remove heat generated by the components of the electronic device. Further, the design of components as well as their arrangement can also impact other properties of the device, such as the overall size of the device, the amount of noise generated by the device, specific functionalities of the device, the cost of manufacturing the device, etc. Consequently, further tailoring and arrangement of components for electronic devices to provide additional or enhanced functionality, without introducing or increasing undesirable device properties, can be desirable.

SUMMARY

According to some aspects of the present disclosure, a portable electronic device can include an enclosure including a frame and a backplate. The portable electronic device can include a coupler interconnecting the frame and the backplate. The coupler can define a first protrusion engaging the frame. The coupler can define a second protrusion engaging the backplate.

In some examples, the coupler can include a rigid polymer and have a dielectric constant of at least 2 ε at 1 MHz. The first protrusion can be adhered within a first recess of the frame. The first recess can extend into the frame at an acute angle relative to a sidewall of the frame. The second protrusion can be adhered within a second recess of the backplate. The enclosure can include a first curved surface and a second curved surface interconnected by a linear surface of the enclosure. The coupler can interconnect the frame and backplate adjacent the linear surface. The portable electronic device can further include a dielectric component extending at least partially between the frame and the backplate. The dielectric component can be at least partially disposed between the first and second protrusions of the coupler.

In some examples, the portable electronic device can further include a display module, a cover glass, a first pressure sensitive adhesive tape and a second pressure sensitive adhesive tape. The cover glass can be disposed over the display module. The first pressure sensitive adhesive tape can couple a corner of the cover glass to the enclosure. The second pressure sensitive adhesive tape can couple the cover glass to a linear portion of the enclosure. The first pressure sensitive adhesive tape can have a greater dynamic shear strength than the second pressure sensitive adhesive tape.

According to another aspect of the present disclosure, an electronic device can include a housing, a processor, an electronic component, a flexible trace, and a biasing element. The processor can be disposed within the housing. The electronic component can be positioned at least partially within the housing. The flexible trace can include a first end electrically coupled to the processor. The flexible trace can include a second end electrically coupled to the electronic component. The biasing element can contact the flexible trace between the first and second ends.

In some examples, the biasing element includes a compressible foam. The biasing element can be disposed between the electronic component and the flexible trace. The first end can electrically couple to a first electrical contact of the processor. The second end can electrically couple to a second electrical contact of the electrical component. A length of the flexible trace can be greater than a distance between the first and second electrical contacts. The biasing element can place the flexible trace under tension. The electrical component can be a display module.

According to another aspect of the present disclosure, an electronic device can include an enclosure, a processor, an antenna, a display module, and a grounding layer. The processor and antenna can be disposed within the enclosure. The display module can be at least partially disposed within the enclosure. The grounding layer can be at least partially disposed over a first surface and a second surface of the display module. The grounding layer can electrically ground the display module to the enclosure.

In some examples, the grounding layer can contact the enclosure at a first location on the enclosure. The grounding layer can contact the enclosure at a second location on the enclosure. The first and second locations can be separated by a distance. The grounding layer can be a conductive tape adhered to a back surface and a side surface of the display module to ground a current induced in the display module by operation of the antenna. The grounding layer can include a portion at least partially disposed over the first and second surfaces of the display module. The grounding layer can include a first tab electrically connecting the portion to the enclosure. The grounding layer can include a second tab electrically connecting the portion to the enclosure.

In some examples, the electronic device can include a cover glass affixed to the enclosure. The first tab can be disposed between the cover glass and the enclosure. An intermediate material can enable the cover glass to move independently from the first tab. The electronic device can include a coating or cosmetic layer disposed over at least a portion of the grounding layer. The grounding layer can include a first relief and a second relief. The first and second reliefs can form a thinned section configured to flex when the display module moves relative to the enclosure.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components, as appropriate. Also, features described with respect to some embodiments can be combined in other embodiments.

According to one aspect of the present disclosure, a portable electronic device can include a housing at least partially defining an internal volume. A display can be coupled to the housing and can be overlaid by a glass cover that, together with the housing, can define the internal volume of the device. The device can include a number of components that can provide desired functionalities and levels of performance. For example, the device can include one or more couplers that interconnect various portions of the housing together. Additionally or alternatively, the portable electronic device can include one or more millimeter-wave antennas. Additionally, or alternatively, the electronic device can include one or more grounding elements or layers that electrically ground the display to the housing.

These and other examples are discussed below with reference to FIGS. 1A-16D. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

Figure 1A:
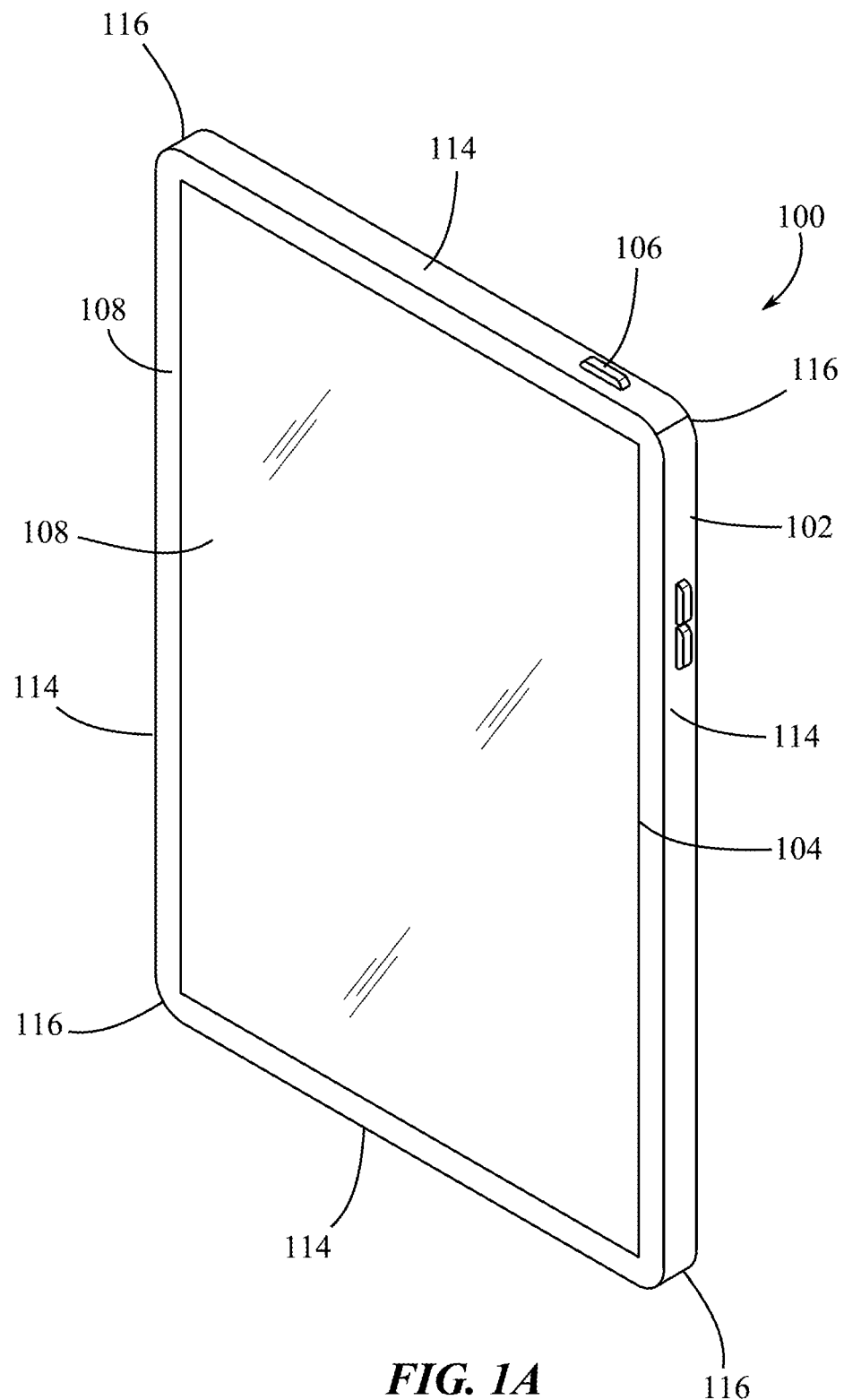
FIG. 1A shows a front view of an electronic device.

FIG. 1A depicts an electronic device 100, such as a tablet computing device. The tablet computer of FIG. 1A is merely one representative example of a device that can be used in conjunction with the systems and methods disclosed herein. Electronic device 100 can correspond to any form of portable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, a portable electronic device, a consumer device, or simply as a device.

The electronic device 100 includes an enclosure or housing 102 at least partially surrounding a display 104. The housing 102 can at least partially define an internal volume that can enclose, or partially enclose, the display and other internal components of the electronic device 100. The housing 102 can be formed of one or more components operably connected together, such as a frame and a backplate. Alternatively, the housing 102 can be formed of a single piece operably connected to the display 104.

The display 104 can provide a visual output to the user. The display 104 can include any suitable display technology, including, but not limited to, a liquid crystal display element, a light emitting diode element, an organic light-emitting display element, an organic electroluminescence element, and the like.

A cover sheet 108 can be positioned over the front surface (or a portion of the front surface) of the electronic device 100. In some examples, at least a portion of the cover sheet 108 can sense touch and/or force inputs. The cover sheet 108 can be formed with any suitable material, such as glass, plastic, sapphire, or combinations thereof. In some examples, touch and force inputs can be received by the portion of the cover sheet 108 that covers the display 104. In some examples, touch and/or force inputs can be received across other portions of the cover sheet 108 and/or portions of the housing 102. Together, the cover sheet 108 and the housing 102 can define the internal volume of the electronic device 100.

Various layers of a display stack (such as the cover sheet 108, display 104, touch sensor layer, force sensor layer, and so on) can be adhered together with an adhesive and/or can be supported by a common frame or portion of the housing 102. A common frame can extend around a perimeter, or a portion of the perimeter, of the layers, can be segmented around the perimeter or a portion of the perimeter, or can be coupled to the various layers of the display stack in another manner.

In some examples, each of the layers of the display stack can be attached or deposited onto separate substrates that can be laminated or bonded to each other. The display stack can also include other layers for improving the structural or optical performance of the display 104, including, for example, polarizer sheets, color masks, and the like. Additionally, the display stack can include a touch and/or force sensor layer for receiving inputs on the cover sheet 108 of the electronic device 100.

In many cases, the electronic device 100 can also include a processor, memory, power supply and/or battery, network connections, sensors, input/output ports, acoustic components, haptic components, digital and/or analog circuits for performing and/or coordinating tasks of the electronic device 100, as described herein. For simplicity of illustration, the electronic device 100 is depicted in FIG. 1A without many of these components, each of which can be included, partially and/or entirely, within the housing 102. The electronic device 100 can further include one or more input components, such as an input component 106. In some examples, the input component 106 can include a physical button, such as a power or sleep/wake button. Additionally, or alternatively, the input component 106 can detect touch input or near touch input. In some examples, the input component 106 can have additional functionalities and can, for example, include a biometric input component 106.

Figure 1B:
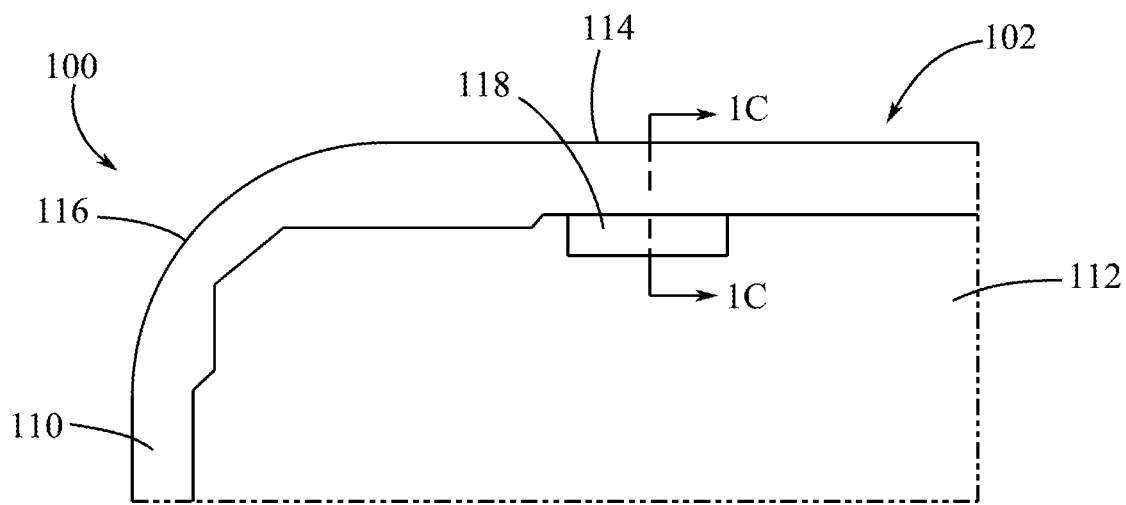
FIG. 1B shows a close-up cross-sectional front view of the electronic device of FIG. 1A.

FIG. 1B shows a close-up cross-sectional front view of the electronic device 100 with the display 104 and cover sheet 108 removed. In some examples, the housing 102 can be formed by a frame 110 and a backplate 112. The frame 110 can extend around a periphery of the housing 102 and form one or more planar or linear surfaces 114 (e.g., side walls of the housing 102) and one or more curved surfaces 116 (e.g., corners of the housing 102). The one or more linear surfaces 114 can extend between the curved surfaces 116. A coupler 118 can be disposed adjacent the linear surface 116 and interconnect the frame 110 to the backplate 112. In other words, the coupler 118 can engage the frame 110 and the backplate 112 to interlock or fasten the frame 110 to the backplate 112. During a drop event (e.g., a user of the electronic device 100 drops the device 100 on the ground or other surface), the coupler 118 can limit or prevent the linear surface 116 of the frame 110 from bending or otherwise separating from the backplate 112. The coupler 118 can include a rigid material, such as, a natural or synthetic plastic. For example, the coupler 118 can be machined, molded, cast, or otherwise formed from a polyethylene, polypropylene, nylon, polytetrafluoroethylene, thermoplastic, a combination thereof, or any other polymer. In examples, the coupler 118 can be manufactured from any material or combination of materials including metals, ceramics, and polymers.

Figure 1C:
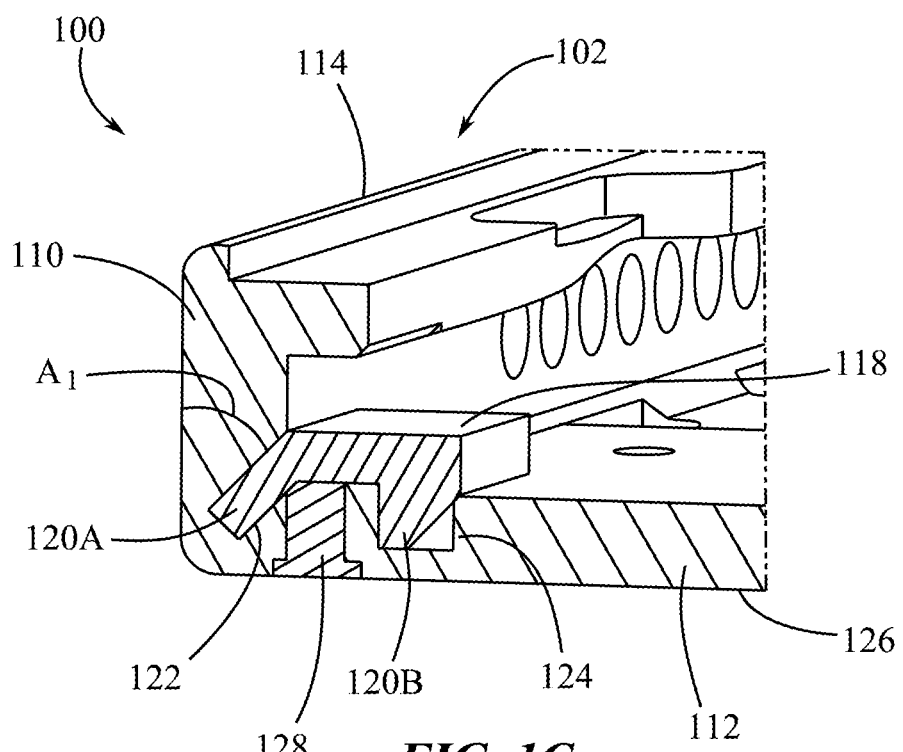
FIG. 1C shows a perspective cross-sectional view of the electronic device of FIG. 1A.

FIG. 1C shows a perspective cross-sectional view of the electronic device 100. The coupler 118 can include a first protrusion 120A and second protrusion 120B. The first protrusion 120A can engage the frame 110, for example, at a recess 122 formed within the frame 110. The recess 122 can extend into the frame 110 at an acute angle $A_1$ relative to the sidewall or linear surface 114 of the frame 110. For example, the recess 122 can extend into the frame 110 at a 45 degree angle relative to the linear surface 114. The second protrusion 120B can engage the backplate 112, for example, at a recess 124 formed within the backplate 112. The recess 124 can extend into the backplate 112 perpendicular to an external surface 126 of the backplate 112. The coupler 118 can be affixed to the housing 102 by any interlocking mechanism, such as, one or more fasteners, an interference fit, adhesive, or a combination thereof.

In some examples, the first and second protrusions 120A, 120B of the coupler 118 can be simultaneously inserted into the respective recesses 122, 124. For example, as shown in FIG. 1C, the second protrusion 120B can be shaped to enable insertion of the second protrusion 120B into the second recess 124 at an angle. In other words, the coupler 118 can be shaped to slide into the first and second recesses 122, 124 while the frame 110 and backplate 112 are already affixed together to ease assembly of the electronic device 100. For example, the frame 110 and the backplate 112 can be interconnected prior to affixing the coupler 118 to the housing 102. As such, the first and second protrusions 120A, 120B can be inserted into the respective first and second recesses 122, 124 at an angle (e.g., about a 45 degree angle between the linear surface 114 and the external surface 126.

In some examples, one or more antennas (not shown) within the electronic device 100 can receive and/or transmit data in the form of electromagnetic waves having particular frequencies and amplitudes. The coupler 118 can be manufactured from a material having a dielectric constant or permittivity that enables optimal antenna performance. For example, the coupler 118 can be manufactured from a rigid polymer that does not provide a conductive path for current induced on the portions of the housing 102 contacting the coupler 118 (e.g., the frame 110 and the backplate 112). In examples, the coupler 118 can be made from a material having a dielectric constant of at least 2 ε at 1 MHz. In some examples, a dielectric 128 can be disposed between a portion of the frame 110 and the backplate 112. The dielectric 128 can electrically isolate one or more portions of the housing 102 to enable wireless communication via one or more antennas. The dielectric 128 can extend between the first and second protrusions 120A, 120B such that at least a portion of the dielectric is disposed between the first and second protrusions 120A, 120B.

Figure 2A:
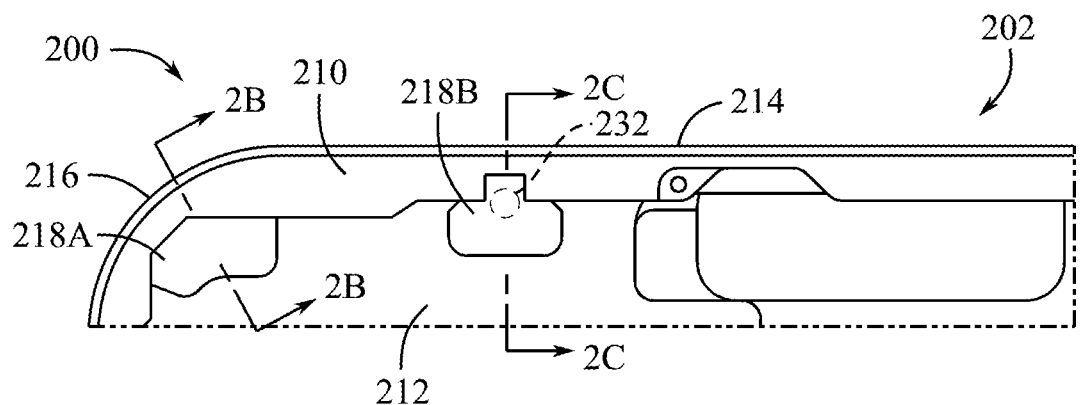
FIG. 2A shows a close-up cross-sectional front view of an electronic device.

FIG. 2A shows a close-up cross-sectional front view of a housing 202 of an electronic device 200 with a display and a cover glass removed. The housing 202 can be substantially similar to, and can include some or all of the features of the housing 102. For example, the housing 202 can include a frame 210 and a backplate 212. The frame 210 and backplate 212 can be at least partially interconnected by a first coupler 218A and a second coupler 218B. The first coupler 218A can be disposed near a curved surface 216 of the frame 210. The second coupler 218B can be disposed near a linear surface 214 of the frame 210. During a drop event (e.g., a user of the electronic device 200 drops the device 200 on the ground or other surface), the coupler 218A can limit or prevent the curved surface 214 of the frame 210 from deforming toward the backplate 212. During a drop event, the coupler 218B can limit or prevent the linear surface 216 of the frame 210 from bending and separating from the backplate 212.

Figure 2B:
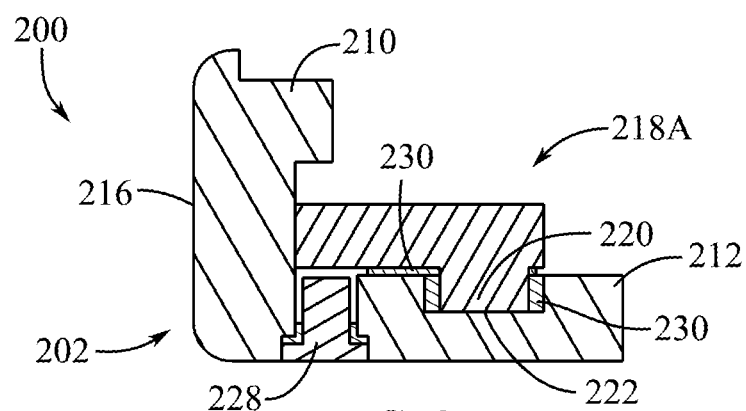
FIG. 2B shows a cross-sectional side view of the electronic device of FIG. 2A.

FIG. 2B shows a cross-sectional side view of the electronic device 200 through the section line 2B-2B illustrated in FIG. 2A. The coupler 218A can interlock or otherwise engage with the backplate 212. For example, as shown in FIG. 2B, the coupler 218A can include a protruding portion 220 disposed within a recess 222 of the backplate 212. The protruding portion 220 can be affixed within the recess 222 by an adhesive 230, such as, an adhesive tape or liquid adhesive. In some examples, a dielectric 228 can be disposed between a portion of the frame 210 and the backplate 212. The dielectric 228 can electrically isolate one or more portions of the housing 202 to enable wireless communication via one or more antennas. For example, the dielectric 228 can be formed from or include a substantially non-conductive material or electrically insulating material such that a portion of the housing 202 (e.g., a portion of the frame 210) can be electrically isolated to act as an antenna for the electronic device 200.

Figure 2C:
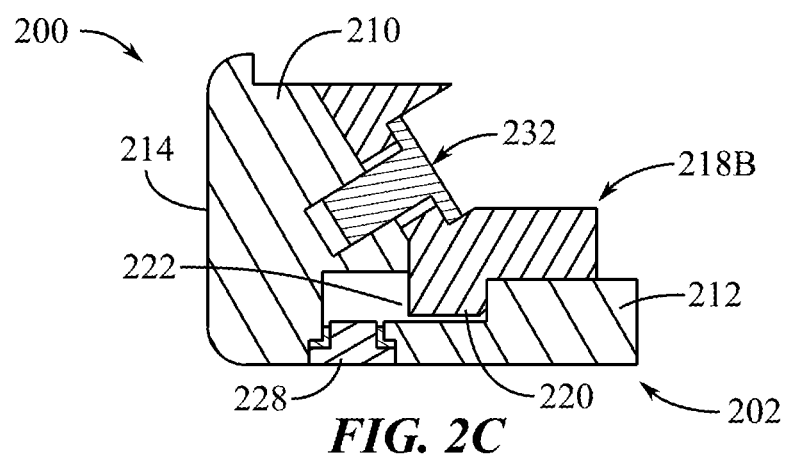
FIG. 2C shows a cross-sectional side view of the electronic device of FIG. 2A.

FIG. 2C shows a cross-sectional side view of the electronic device 200 through the section line 2C-2C illustrated in FIG. 2A. The coupler 218B can interlock or otherwise engage with the backplate 212 and the frame 210. For example, like the coupler 218A, the coupler 218B can include a protruding portion 220 disposed within a recess 222 of the backplate 212. The protruding portion 220 can be affixed within the recess 222 by an adhesive, such as, an adhesive tape or liquid adhesive. The coupler 218B can be affixed to the frame 210 by one or more fasteners 232. The fastener 232 can engage the frame 210 to interlock the coupler 218B to the frame 210, for example, by threadably engaging with the frame 210.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding pressure sensitive adhesive tapes having various material properties and characteristics, can apply not only to the specific examples discussed herein, but to any number of examples in any combination. Various examples of electronic devices including components, such as pressure sensitive adhesive tapes, having various features in various arrangements are described below, with reference to FIGS. 3A and 3B.

Figure 3A:
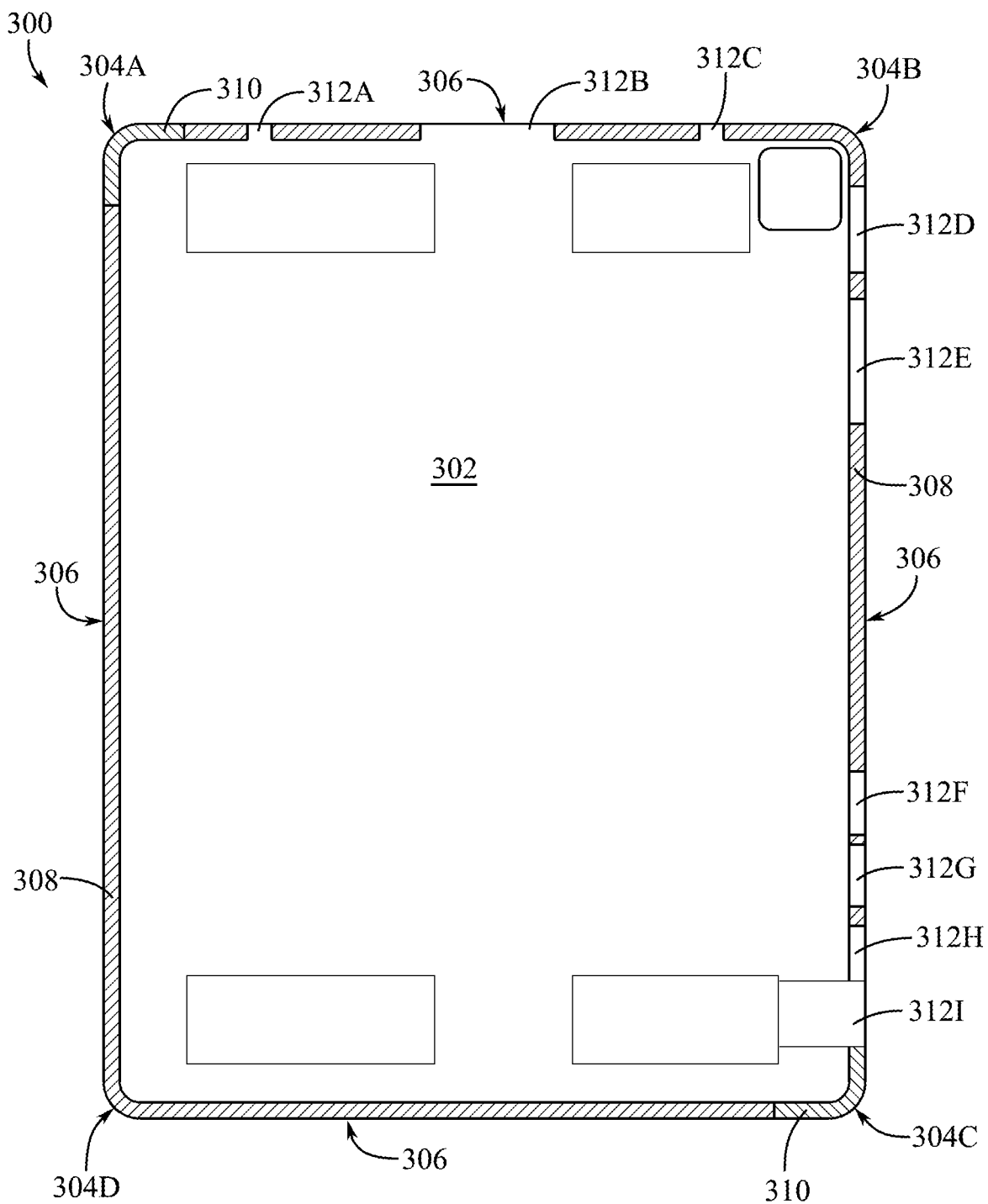
FIG. 3A shows a front cross-sectional view of an electronic device.

FIG. 3A shows a cross-sectional view of an electronic device 300 including a housing or enclosure 302. The electronic device 300 can be substantially similar and include one or more of the features or components of the electronic devices 100, 200. The enclosure 302 can include curved portions 304A-D (e.g., corners) and linear portions 306 (e.g., sidewalls). In some examples, a cover glass (now shown) can be affixed to the enclosure 302 using pressure sensitive adhesive (PSA) tape to reliably retain the cover glass to the enclosure 302. For example, a first PSA tape 308 can be disposed between the cover glass and the enclosure 302 at curved portions 304A, 304C while a second PSA tape 310 can be disposed between the cover glass and the enclosure 302 at curved portions 304B, 304D and the linear portions 306. In some examples, one or more sections 312A-I of the periphery of the enclosure 302 can be devoid of the second PSA tape 310. For example, the enclosure 302 can define slots or cutouts at the sections 312A-I devoid of the second PSA tape 310. The slots or cutouts can be formed to accommodate antenna windows, input components (e.g., volume buttons), communication ports, a combination thereof, or any other feature or component of the electronic device 300.

The first PSA tape 308 can have one or more material properties or characteristics that differ from the second PSA tape 310. For example, the first PSA tape 308 can have a greater dynamic shear strength than a dynamic shear strength of the second PSA tape 310. The dynamic shear strength of the first PSA tape 308 can be between 2 and 15 times higher than the dynamic shear strength of the second PSA tape 310. The dynamic shear strength of the first PSA tape 308 can be between 1500 N·mm and 10,000 N·mm while the dynamic shear strength of the second PSA tape can be between 100 N·mm and 1,000 N·mm.

Other material properties or characteristics of the first PSA tape 308 can additionally, or alternatively be different than the material properties or characteristics of the second PSA tape 310, such as, activation pressure, static modulus, tensile strength, adhesion, a combination thereof, or any other material property or characteristic. Affixing the cover glass to the enclosure 302 with PSA tapes having one or more differing material properties can be beneficial, for example, in preventing movement or shifting of the cover glass relative to the enclosure 302 during a drop event. For example, a greater dynamic shear strength can better retain the cover glass to the enclosure 302 such that the cover glass shifts less relative to the enclosure 302 during the drop event, especially a drop event in which the ground makes contact with the electronic device 300 at one of the curved portions 304A, 304B. Less shifting of the cover glass can reduce the likelihood that the cover glass will contact enclosure 302 (or another surface) and break or crack due to the impact.

Figure 3B:
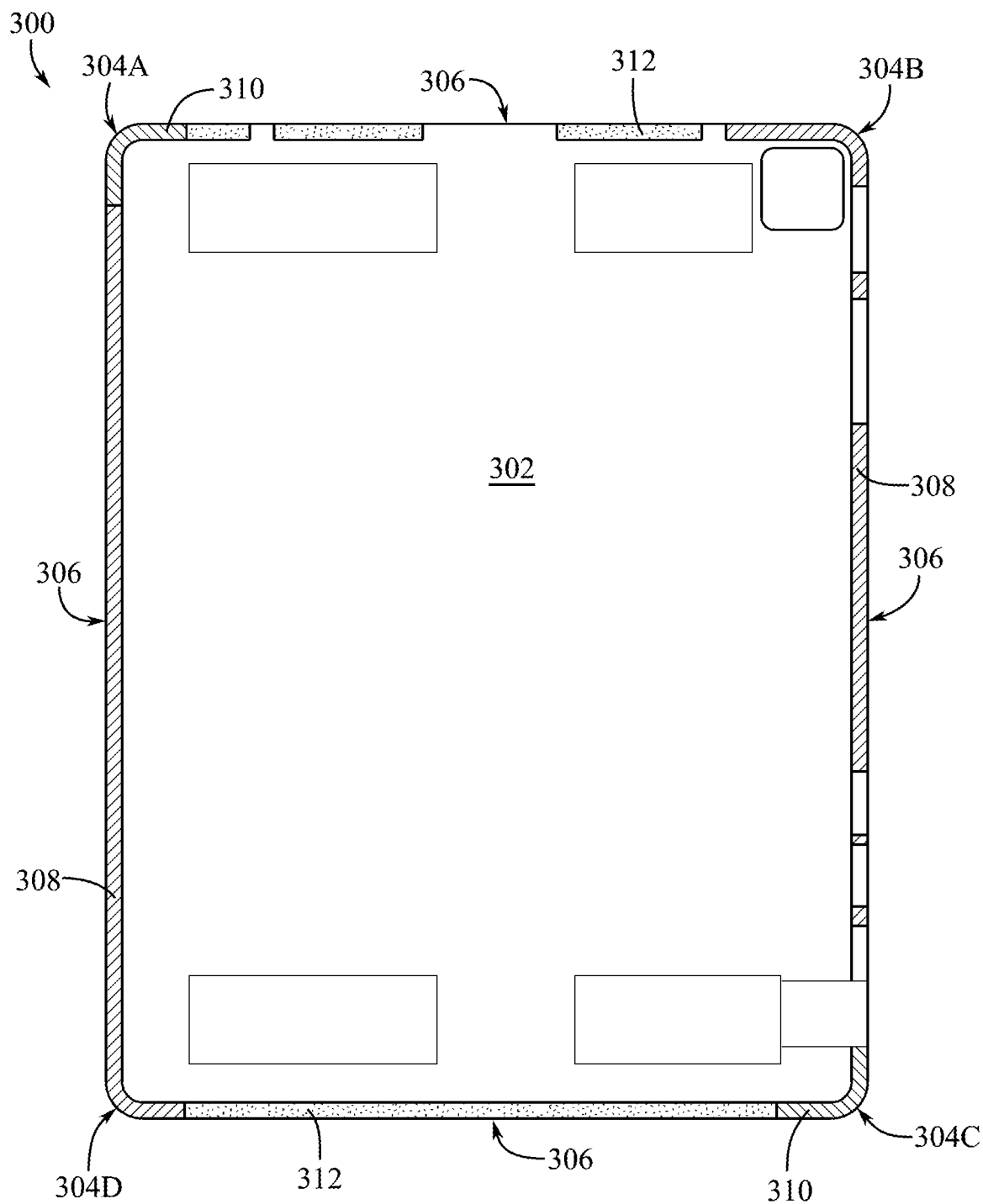
FIG. 3B shows a front cross-sectional view of an electronic device.

FIG. 3B shows a cross-sectional view of the electronic device 300 including the first PSA tape 308, the second PSA tape 310, and a third PSA tape 314 disposed on the enclosure 302. The third PSA tape 314 can have one or more material properties or characteristics that differ from the material properties or characteristics of the first and second PSA tapes 308, 310. For example, the third PSA tape 312 can have a dynamic shear strength that differs from the dynamic shear strengths of the first and second PSA tapes 308, 310. Additionally, or alternatively, the third PSA tape 312 can have other material properties or characteristics different from the material properties or characteristics of the first and/or second PSA tapes 308, 310, such as, activation pressure, static modulus, tensile strength, adhesion, a combination thereof, or any other material property or characteristic.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding one or more elements which bias a flexible trace, can apply not only to the specific examples discussed herein, but to any number of examples in any combination. Various examples of electronic devices including components, such as a biasing element, having various features in various arrangements are described below, with reference to FIGS. 4A-4C.

Figure 4A:
FIG. 4A shows a cross-sectional side view of an electronic device.

FIG. 4A shows a cross-sectional side view of an electronic device 400. The electronic device 400 can be substantially similar to, and can include some or all of the features of the electronic devices 100, 200, 300. The electronic device 400 can include a housing 402 and a cover glass 404 affixed to the housing 402. The housing 402 and cover glass 404 can define an internal volume within the electronic device 400. Multiple electronic components can be disposed within the internal volume of the electronic device 400. For example, a processor 406 and a display module 408 can be disposed within the housing 402. The electronic device 400 can include one or more flexible traces that electrically connect multiple electrical components within the electronic device 400. The processor 406 and the display module 408 can be electrically coupled by a flexible trace 410 extending within the internal volume of the electronic device 400. More specifically, the flexible trace 410 can have a first end 412A electrically coupled to an electrical contact of the processor 406 and a second end 412B electrically coupled to an electrical contact of the display module 408. While the flexible trace 410 is shown as electrically connecting the processor 406 to the display module 408 in FIG. 4A, the electronic device 400 can include additional, or alternative, flexible traces electrically coupling other electronic components of the electronic device 400.

A distance D between the respective electrical contacts can vary, such as, based on tolerances of the electronic components of the electronic device 400. For example, the size and shape of each electrical component can vary such that the distance D varies from one electronic device 400 to another. A length of the flexible trace 410 can be longer than the distance D. However, the flexible trace 410 can be too long in electronic devices having a distance D that is relatively short. If the length of the flexible trace 410 is too long relative to the distance D, the flexible trace 410 can contact other electrical components within the electronic device 400 and damage or interfere with operation of the contacted electrical component.

Figure 4B:
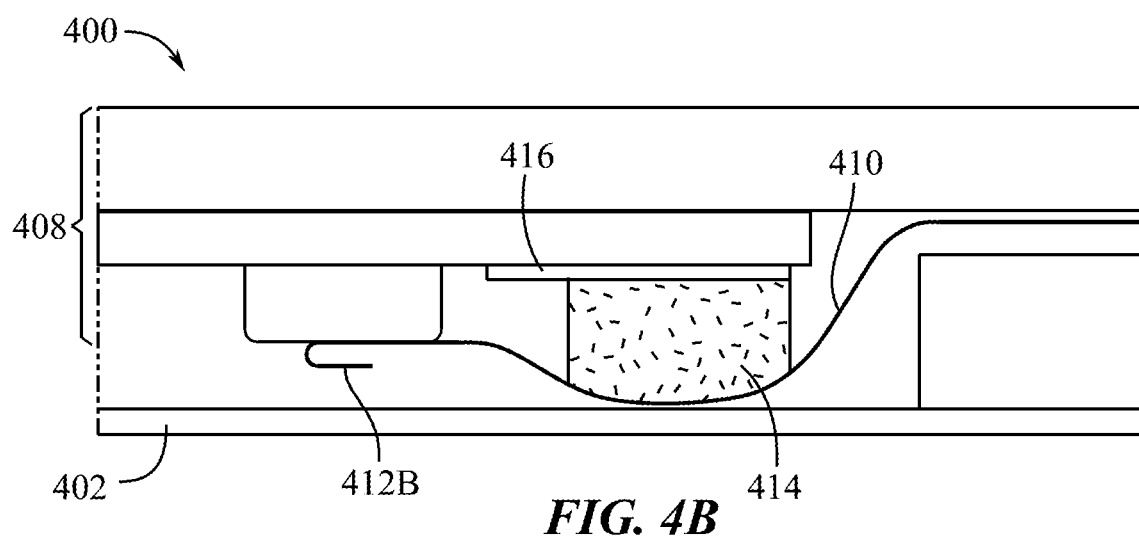
FIG. 4B shows a close-up cross-sectional side view of the electronic device of FIG. 4A.
Figure 4C:
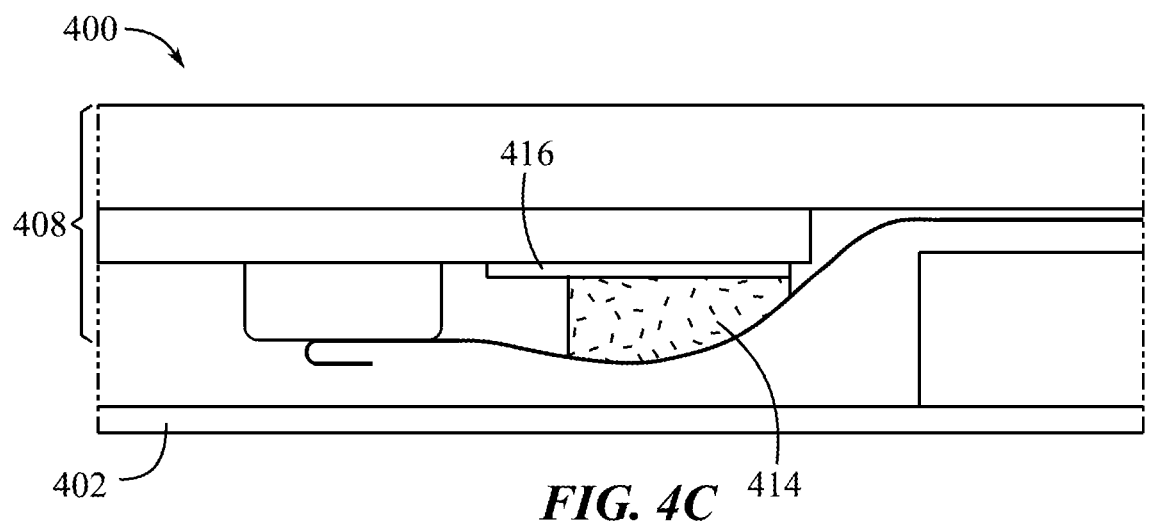
FIG. 4C shows a close-up cross-sectional side view of the electronic device of FIG. 4A.

In some examples, as illustrated in FIGS. 4B and 4C, a biasing element 414 can contact the flexible trace 410 between the first and second ends 412A, 412B to place the flexible trace 410 under tension and thereby inhibit or limit the flexible trace 410 from making unwanted contact with electrical components of the electrical device 400. For example, the biasing element 414 can be disposed between the flexible trace 410 and the display module 408 and bias a portion of the flexible trace 410 away from the display module 408. The biasing element 414 can include any material or structure capable of biasing the flexible trace 410 to place the electrical trace 410 under tension. In some examples, the biasing element 414 can be a spring or elastomeric material that is capable exerting a force on the flexible trace 410, such as, a compressible foam. The biasing element 414 can be adhered or affixed anywhere along the distance D to contact the flexible trace 410. For example, as shown in FIGS. 4B and 4C, the biasing element 414 can be affixed to the display module 408 by a pressure sensitive adhesive tape 416 or other adhesive. Alternatively, or additionally, the biasing element 414 can be affixed to an electrical component by an adhesive, a fastener, or weld.

FIG. 4B shows an example of the electronic device 400 that has a relatively shorter distance D such that additional length of the flexible trace 410 can be taken up by the biasing element 414 to limit the additional length of flexible trace 410 from contacting other electrical components within the electronic device 400. FIG. 4C shows an example of the electronic device 400 that has a relatively longer distance D such that the flexible trace 410 does not have unnecessary length and compresses the biasing element 414.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding materials which block backlighting, can apply not only to the specific examples discussed herein, but to any number of examples in any combination. Various examples of electronic devices including components, such as opaque materials, having various features in various arrangements are described below, with reference to FIGS. 5A and 5B.

Figure 5A:
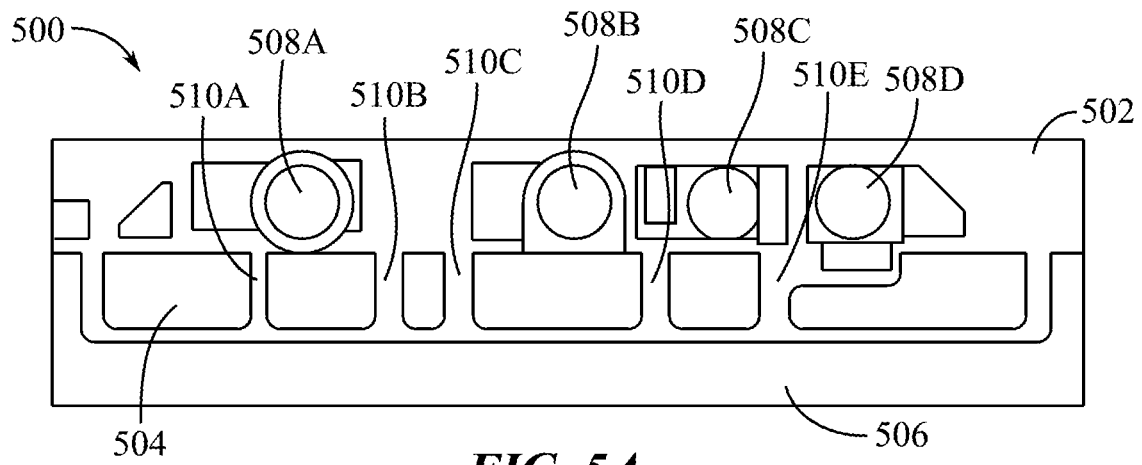
FIG. 5A shows a close-up front view of an array of sensors of an electronic device.

FIG. 5A shows a close-up front view of an electronic device 500 including a housing 502, a support structure 504, a display 506, and an array of sensors 508A-D. The electronic device 500 can be substantially similar to, and can include some or all of the features of the electronic devices 100, 200, 300, 400. The array of sensors 508A-D can include one or more sensors, such as, a microphone, an ambient light sensor, one or more cameras, an infrared sensor, a combination thereof, or any other sensor. The support structure 504 can include one or more slots 510A-E that provide paths for electrical traces or wires to extend from a processor (not shown) to each of the sensors within the array of sensors 508A-D.

Figure 5B:
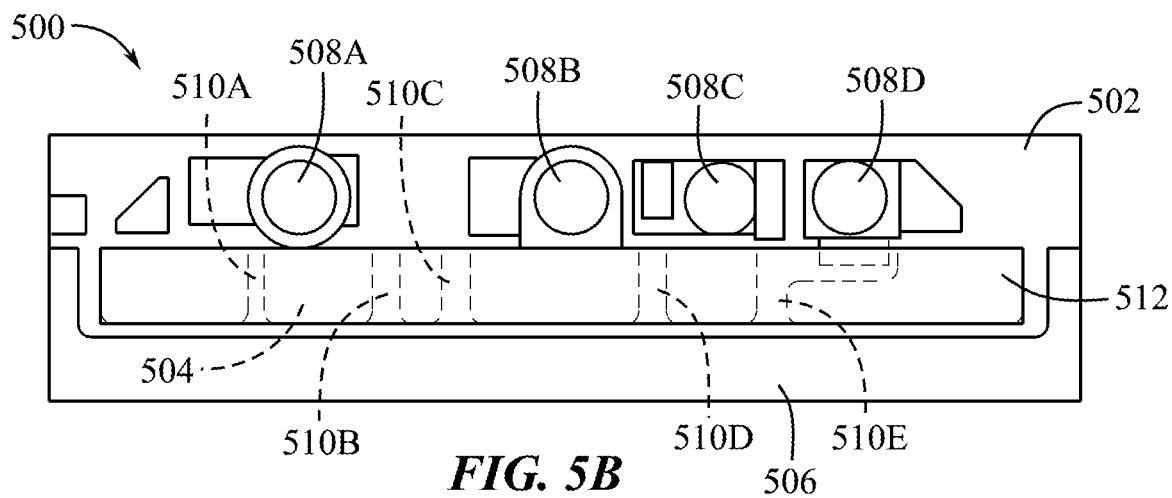
FIG. 5B shows a close-up front view of the array of sensors of FIG. 5A with a light blocking layer applied.

While a backlight of the display 506 is illuminated, emitted light can highlight or otherwise render one or more of the slots 510A-E visible by the user through the cover glass (now shown). As shown in FIG. 5B, a light blocking or opaque material 512 can be disposed over one or more of the slots 510A-E to prevent light emitted by the display 506 from rendering the slots 510A-E visible to the user. In some examples, the opaque material 512 can be a light blocking tape adhered over the support structure 504.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding printed circuit boards and support structures, can apply not only to the specific examples discussed herein, but to any number of examples in any combination. Various examples of electronic devices including components, such rigid printed circuit boards and support structures, having various features in various arrangements are described below, with reference to FIG. 6.

Figure 6:
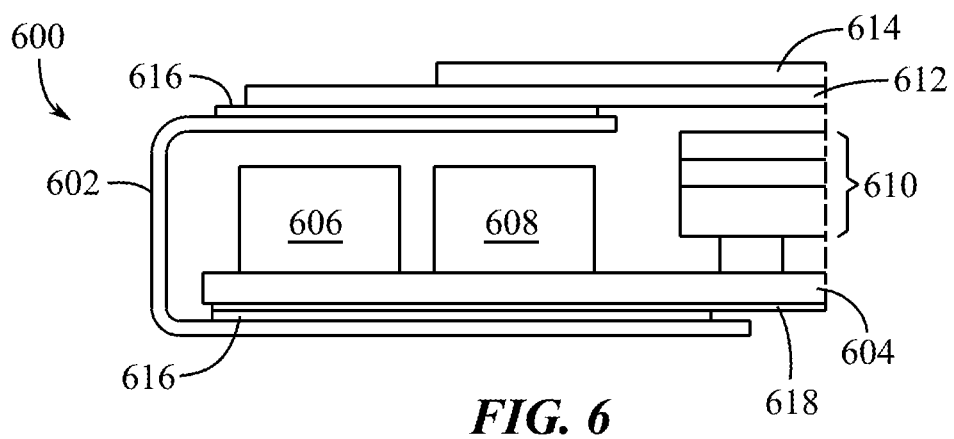
FIG. 6 shows a close-up cross-sectional side view of a display module.

FIG. 6 shows a close-up cross-sectional side view of a display module 600 including a support structure 602, a printed circuit board (PCB) 604, electrical components 606, 608, optical films 610, and transparent layers 612, 614. The optical films 610 can be disposed between the PCB 604 and the transparent layer 612. In some examples, the PCB 604 can include an array of LEDs that emit light through optical films 610 and transparent layers 612, 614. The electrical components 606, 608 can be electrically coupled to the PCB 604 and provide electrical signals to the array of LEDs. The PCB 604 can provide structural rigidity or support for the display module 600. For example, the PCB 604 can be sufficiently rigid to supply structural support such that the display module 600 does not require a rigid baseplate or chassis which would increase a thickness of the display module 600 and necessarily increase a total thickness of the electronic device.

The support structure 602 can be affixed to the PCB 604 and the transparent layer 612 to retain the components of the display module 600 in a fixed position relative to one another. The support structure 602 can be affixed to the PCB 604 and the transparent layer 612 using one or more fasteners, welds, adhesives, or a combination thereof. For example, the support structure 602 can be affixed to the PCB 604 and the transparent layer 612 by a pressure sensitive adhesive tape 616. In some examples, the pressure sensitive adhesive tape 616 can be affixed to a shielding layer 618 of the PCB 604 to electrically shield and ground the PCB 604. The shielding layer 618 can be a conductive tape that is adhered to one or more surfaces of the PCB 604.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding support structures for display modules, can apply not only to the specific examples discussed herein, but to any number of examples in any combination. Various examples of electronic devices including components, such as support structures for display modules, having various features in various arrangements are described below, with reference to FIGS. 7A and 7B.

Figure 7A:
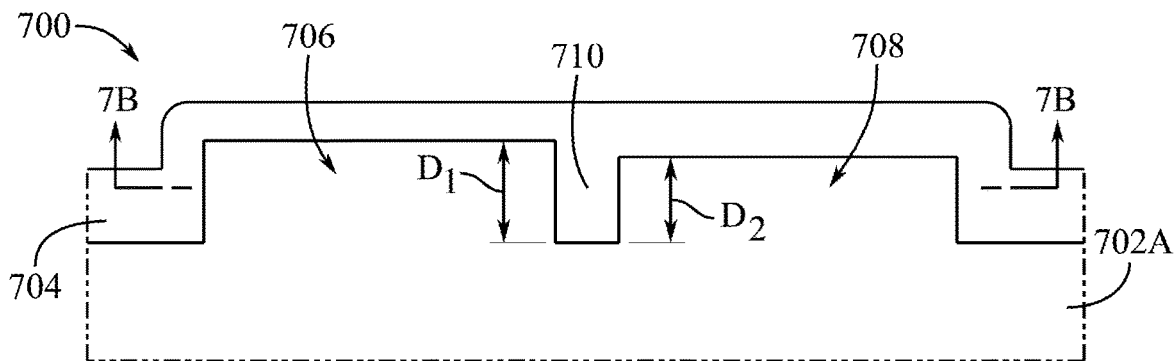
FIG. 7A shows a close-up front view of a display module.
Figure 7B:
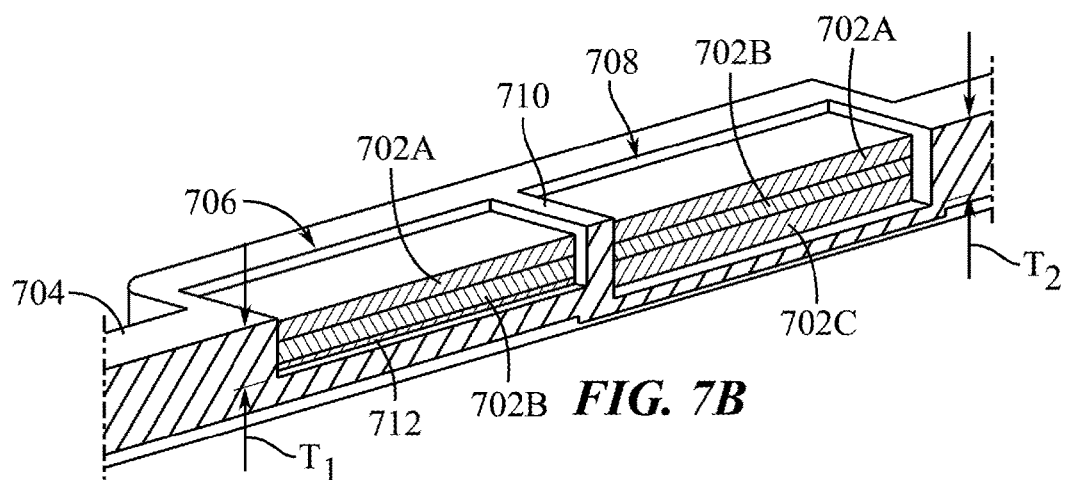
FIG. 7B shows a close-up cross-sectional perspective view of the display module of FIG. 7A.

FIGS. 7A and 7B show a display module 700 having optical films 702A-C supported by a support structure 704. The support structure 704 can form a first inlet 706 and a second inlet 708 separated by an intermediate wall 710. The intermediate wall 710 can provide additional rigidity to the support structure 704. The intermediate wall 710 can also separate the first and second inlets 706, 708 such that the first inlet 706 can have a first depth $D_1$ and a first thickness $T_1$ that are independent of a second depth $D_2$ and second thickness $T_2$ of the second inlet 708. In some examples, the first depth $D_1$ can be greater than the second depth $D_2$. Alternatively, the first depth $D_1$ of the first inlet 706 can be less than or equal to the second depth $D_2$ of the second inlet 708. A greater depth can provide additional surface area within the first inlet 706 for adhering one of the optical films 702A-C within the first inlet 706. For example, as shown in FIG. 7B, a pressure sensitive adhesive tape 712 can adhere the optical film 702B within the first inlet 706.

In some examples, the first and second inlets 706, 708 can each receive one or more of the optical films 702A-C. For example, as shown in FIG. 7B, the first inlet 706 can receive the optical film 702A and the optical film 702B while the second inlet 708 can receive optical films 702A, 702B, and 702C. One or both of the first and second inlets 706, 708 can receive an optical film 702A-C that is not disposed within the other inlet. For example, a portion of the optical film 702C can be disposed within the second inlet 708 but not within the first inlet 706, as shown in FIG. 7B. Consequently, a first thickness $T_1$ of the first inlet 706 can be different from a second thickness $T_2$ of the second inlet 708. For example, the second thickness $T_2$ of the second inlet 708 can be greater than the first thickness $T_1$ of the first inlet 706. Alternatively, the first thickness $T_1$ of the first inlet 706 can be greater than or equal to the second thickness $T_2$ of the second inlet 708.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding modified support structures, can apply not only to the specific examples discussed herein, but to any number of examples in any combination. Various examples of electronic devices including components, such as modified support structures, having various features in various arrangements are described below, with reference to FIG. 8.

Figure 8:
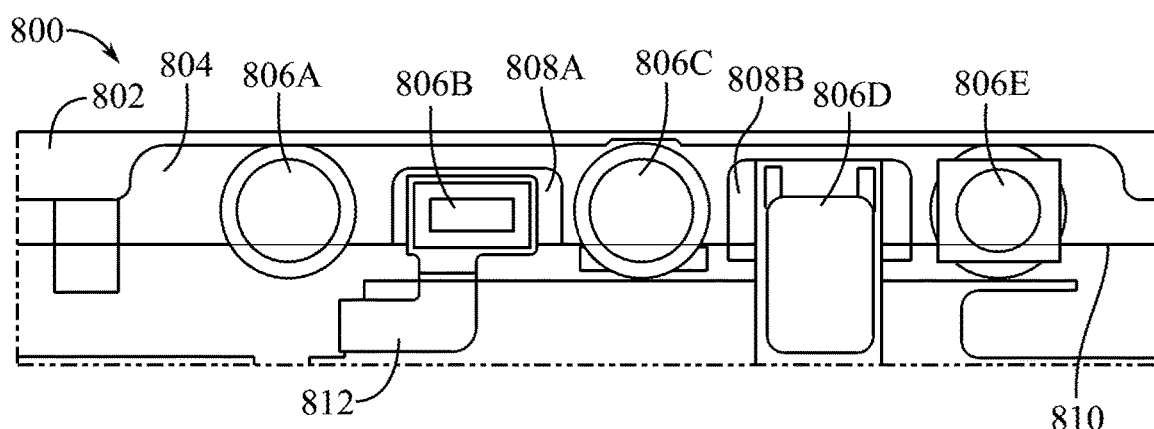
FIG. 8 shows a close-up cross-sectional front view of an array of sensors of an electronic device.

FIG. 8 shows a close-up front view of an electronic device 800 including a housing 802, a support structure 804, and an array of sensors 806A-E. The electronic device 800 can be substantially similar to, and can include some or all of the features of the electronic devices 100, 200, 300, 400, 500. The array of sensors 806A-E can include one or more sensors, such as, a microphone, an ambient light sensor, one or more cameras, an infrared sensor, a combination thereof, or any other sensor. One or more of the sensors 806A-E can be disposed in one or more recesses 808A, 808B formed within the support structure 804. For example, as shown in FIG. 8, the sensor 806B can be disposed within the recess 808A and the sensor 806D can be disposed within the recess 808B. Alternatively, or additionally, one or more edges 810 of the support structure 804 can be chamfered, rounded, stepped, or formed to accommodate a flexible trace 812 extending to one or more of the sensors within the array of sensors 806A-E. In some examples, the support structure 804 can include a chamfer or rounded shape along an entire length of the edge 810. In some examples, the support structure 804 can include a chamfer or rounded shape at distinct sections of the edge 810. For example, the edge 810 adjacent the recess 808A can be chamfered or rounded to accommodate the flexible trace 812.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding display modules including optical films and a support structure, can apply not only to the specific examples discussed herein, but to any number of examples in any combination. Various examples of electronic devices including components, such as display modules having optical films and support structures, having various features in various arrangements are described below, with reference to FIG. 9.

Figure 9:
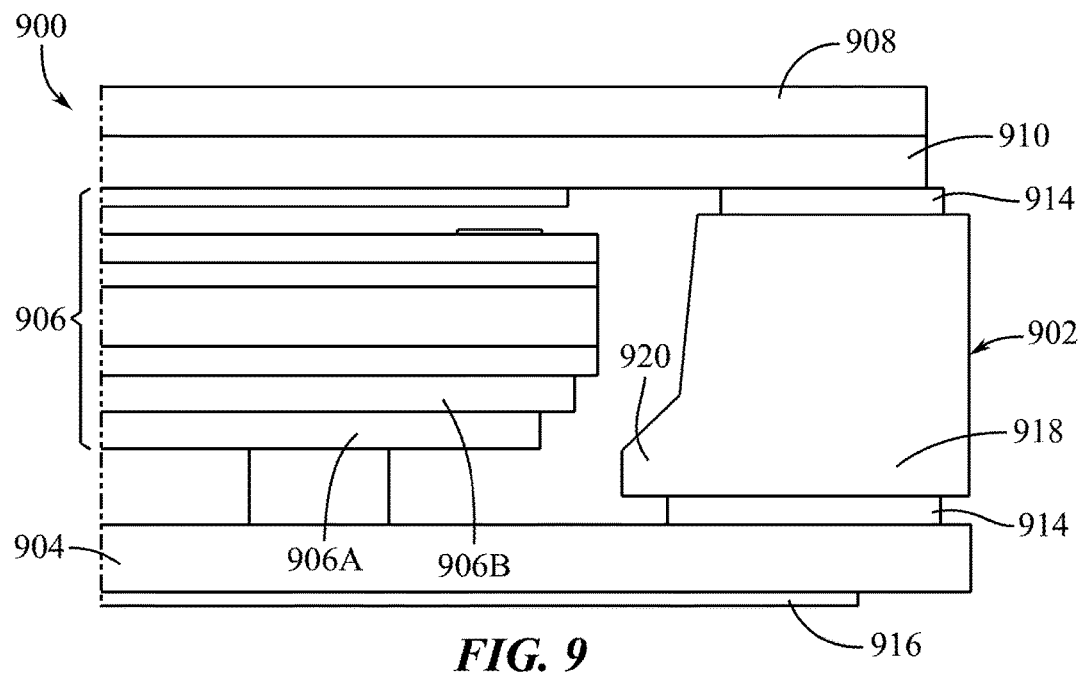
FIG. 9 shows a close-up cross-sectional side view of a display module.

FIG. 9 shows a close-up cross-sectional side view of a display module 900 having a support structure 902, a PCB 904, optical films 906, and transparent layers 908, 910. In some examples, the support structure 902 can be affixed between the transparent layer 908 and the PCB 904. For example, the support structure 902 can be adhered between the transparent layer 908 and the PCB 904 by one or more layers of pressure sensitive adhesive tape 914.

As previously described with reference to FIG. 6, the PCB 904 can provide structural rigidity or support for the display module 900. For example, the PCB 904 can be sufficiently rigid to supply structural support such that the display module 900 does not require a rigid baseplate or chassis which would increase a thickness of the display module 900 and necessarily increase a total thickness of the electronic device. In some examples, a shielding layer 916 can be adhered to the PCB 904 to electrically shield and ground the PCB 904. The shielding layer 916 can be a conductive tape that is adhered to one or more surfaces of the PCB 904.

In some examples, one or more of the optical films 906 can be staggered, notched, or cut such that a base 918 of the support structure 902 can be wider to increase the available surface area to which the PSA tape 914 can be adhered. For example, optical films 906A and 906B can be staggered, notched, or cut such that a protrusion 920 of the base 918 can extend toward the optical films 906 and define a greater surface area of the support structure 902 to which PSA tape 914 can be applied. While only optical films 906A and 906B are shown as staggered, notched, or cut in FIG. 9, additional, or alternative optical films 906 can be staggered, notched, or cut in other examples.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding printed circuit boards having spacers, can apply not only to the specific examples discussed herein, but to any number of examples in any combination. Various examples of electronic devices including components, such as printed circuit boards, having various features in various arrangements are described below, with reference to FIGS. 10A and 10B.

Figure 10A:
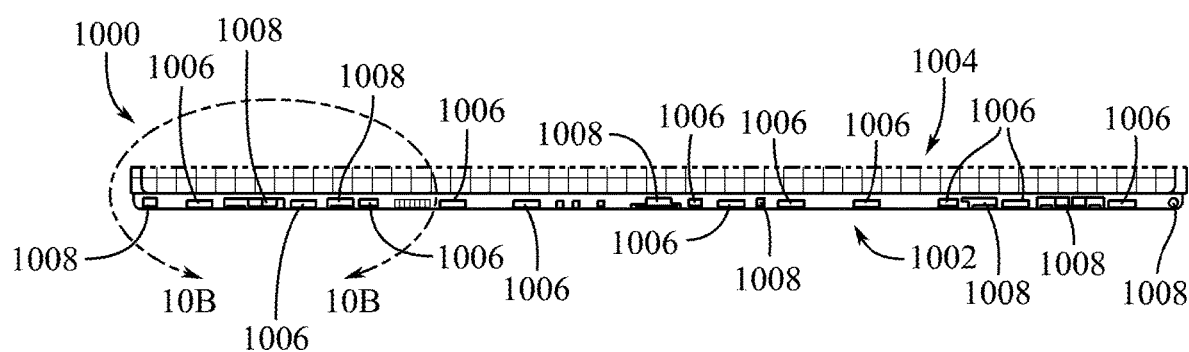
FIG. 10A shows a top cross-sectional view of a display module.

FIG. 10A shows a front cross-sectional view of a display module 1000. More specifically, FIG. 10A shows a side portion of the display module 1000 including a PCB 1002 electrically coupled with an array of LEDs 1004. The PCB 1002 can include electronic components 1006 that provide electrical signals other components of the display module 1000. For example, the electronic components 1006 can be drivers that provide electrical power and/or signals to the array of LEDs 1004 to generate a display graphic for an electronic device. During a drop event, other components within the electronic device can shift and physically contact the PCB 1002 and/or the electronic components 1006 disposed on the PCB 1002. Such physical contact can damage the electronic components 1006, damage electrical traces within the PCB 1002, or otherwise render portions of the PCB 1002 inoperable. One or more spacers 1008A, 1008B can be disposed on vacant portions of the PCB 10002 (i.e., areas on the surface of the PCB 1002 that are not occupied by electronic components 1006). The one or more spacers 1008A, 1008B can limit or reduce physical contact between the PCB 1002 and other components of the electronic device.

Figure 10B:
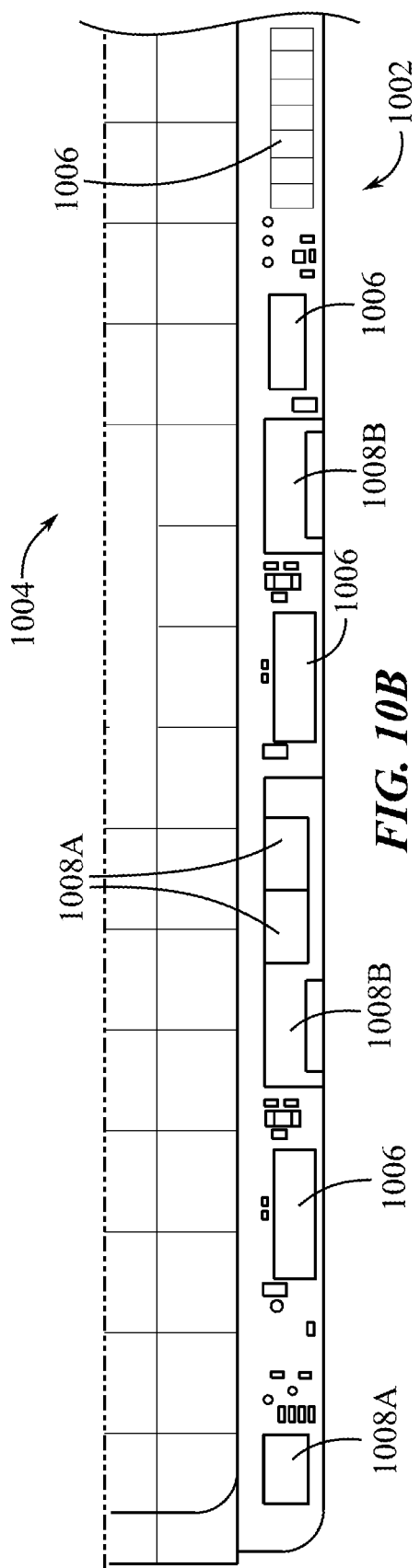
FIG. 10B shows a detailed view of the display module of FIG. 10A.

FIG. 10B shows a detailed view of the display module 1000. In some examples, the one or more spacers 1008A can include a different material or material property from the spacers 1008B. For example, the spacers 1008A can be made from a glass-reinforced epoxy while the spacers 1008B can be an injection-molded polycarbonate plastic. Additionally, or alternatively, the spacers 1008A, 1008B can be include polymers, metals, ceramics, or combinations thereof. Each of the spacers 1008A, 1008B can be affixed to the PCB 1002, for example, by an adhesive, fastener, weld, a soldering process, or combination thereof. In some examples, each of the spacers 1008B can have unique shapes and sizes to fit within regions of the PCB 1002 that do not have an electronic component 1006.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding flexible traces and stiffeners, can apply not only to the specific examples discussed herein, but to any number of examples in any combination. Various examples of electronic devices including components, such as flexible traces and stiffeners, having various features in various arrangements are described below, with reference to FIG. 11.

Figure 11:
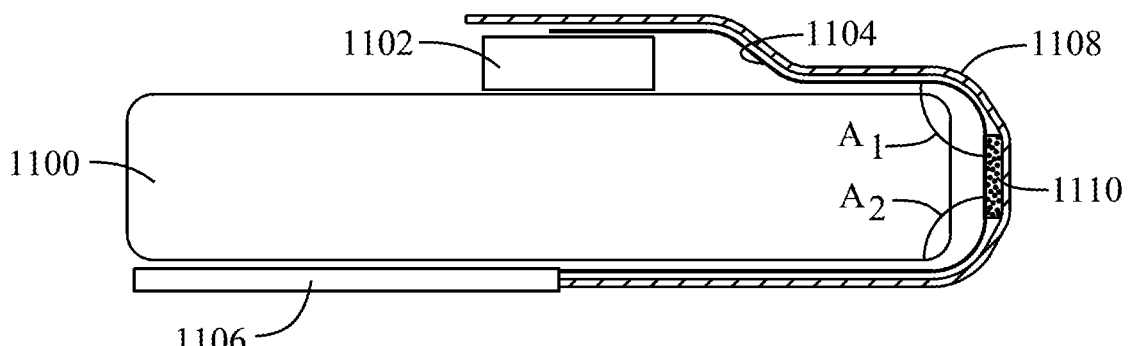
FIG. 11 shows an up-close cross-sectional side view of a display module.

FIG. 11 shows an up-close cross-sectional side view of a display module 1100 electrically coupled to a processor 1102 by a flexible trace 1104. In some examples, the flexible trace 1104 can extend around the display module 1100 and couple to an electronic component 1106 (e.g., processor, circuit board, field programmable gate array (FPGA), logic board, a device driver, or another type of electronic component) of the display module 1100. At least a portion of the flexible trace 1104 can be overlaid by a cover layer 1108. The cover layer 1108 can be adhered to the flexible trace 1104 and shield or otherwise protect the flexible trace 1104 from engaging other components within the electronic device.

In some examples, a stiffener 1110 can be disposed between a section of the flexible trace 1104 and a section of the cover layer 1108. The stiffener 1110 can force the flexible trace 1104 to bend about the display module 1100 such that the flexible trace 1104 can be disposed nearer the display module 1100. For example, the stiffener 1110 can be adhered to the flexible trace 1104 to cause the flexible trace 1104 to bend to form angles $A_1$, $A_2$. The section of the flexible trace 1104 that is adhered to the stiffener 1110 can be held planar such that the section of the flexible trace 1104 can be positioned closer to the display module 1100. Otherwise, the flexible trace 1104 may extend further from the display module 1100 and contact another electronic component or housing of the electronic device.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding display modules having various material properties and characteristics, can apply not only to the specific examples discussed herein, but to any number of examples in any combination. Various examples of electronic devices including components, such as display modules, having various features in various arrangements are described below, with reference to FIGS. 12A and 12B.

Figure 12A:
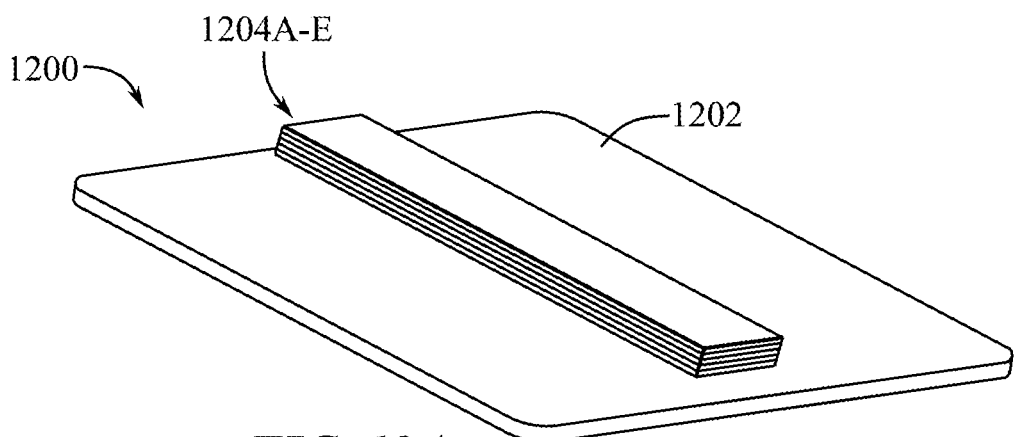
FIG. 12A shows a back perspective view of a display module.
Figure 12B:
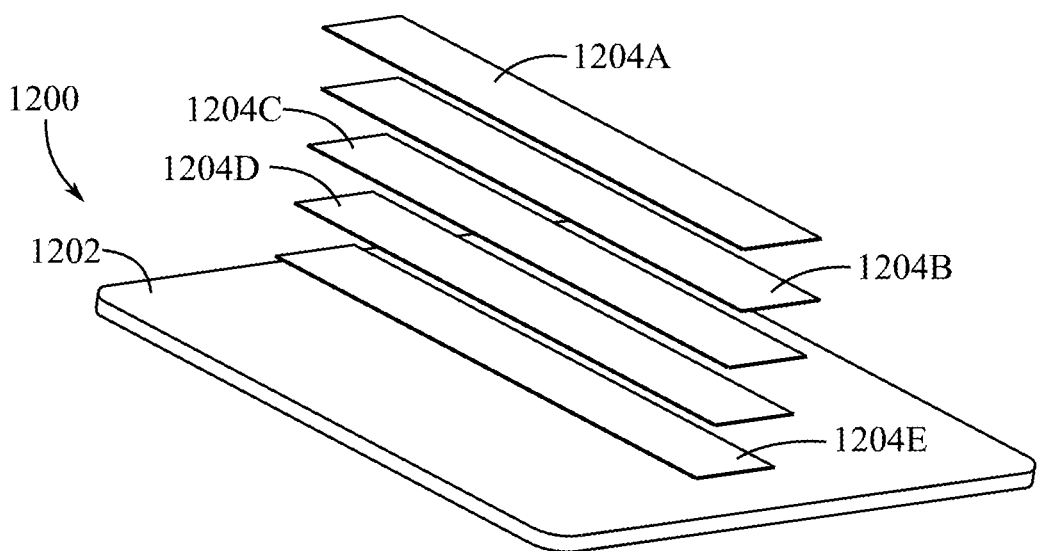
FIG. 12B shows a partially exploded back perspective view of the display module of FIG. 12A.

FIG. 12A shows a back perspective view of a display module 1200 having surface 1202 at least partially covered by one or more layers 1204A-E. FIG. 12B shows a partially exploded view of the layers 1204A-E that overlay a portion of the surface 1202. While each of the layers 1204A-E are illustrated as being disposed in a particular sequence and over a particular position relative to the surface 1202, some of the layers 1204A-E can be omitted, rearranged, or positioned at other positions relative to the surface 1202. For example, the layer 1204E can cover all or most of the surface 1202 in some examples. The layer 1204A can be a polyester tape shielding, protecting, waterproofing, or otherwise acting as a barrier between the display module 1200 and other components within the electronic device. The layer 1204B can include an elastic material that cushions or pads the display module 1200 during a drop event or other action that shifts other components of the electronic device into the display module 1200 or vice versa. The layer 1204C can be a double-sided pressure sensitive adhesive tape. The layer 1204D can be a stiffener or semi-rigid member that distributes a concentrated impact at the display module 1200 over a greater area of the layer 1204D to reduce or prevent damage to the display module 1200. The layer 1204E can be a conductive material, such as, a conductive pressure sensitive adhesive tape that grounds the display module 1200 and/or shields the display module from electromagnetic waves emitted by other electronic components of the electronic device.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding wireless communication and antennas, can apply not only to the specific examples discussed herein, but to any number of examples in any combination. Various examples of electronic devices including components, such as millimeter-wave antenna systems, having various features in various arrangements are described below, with reference to FIGS. 13A-13C.

Figure 13A:
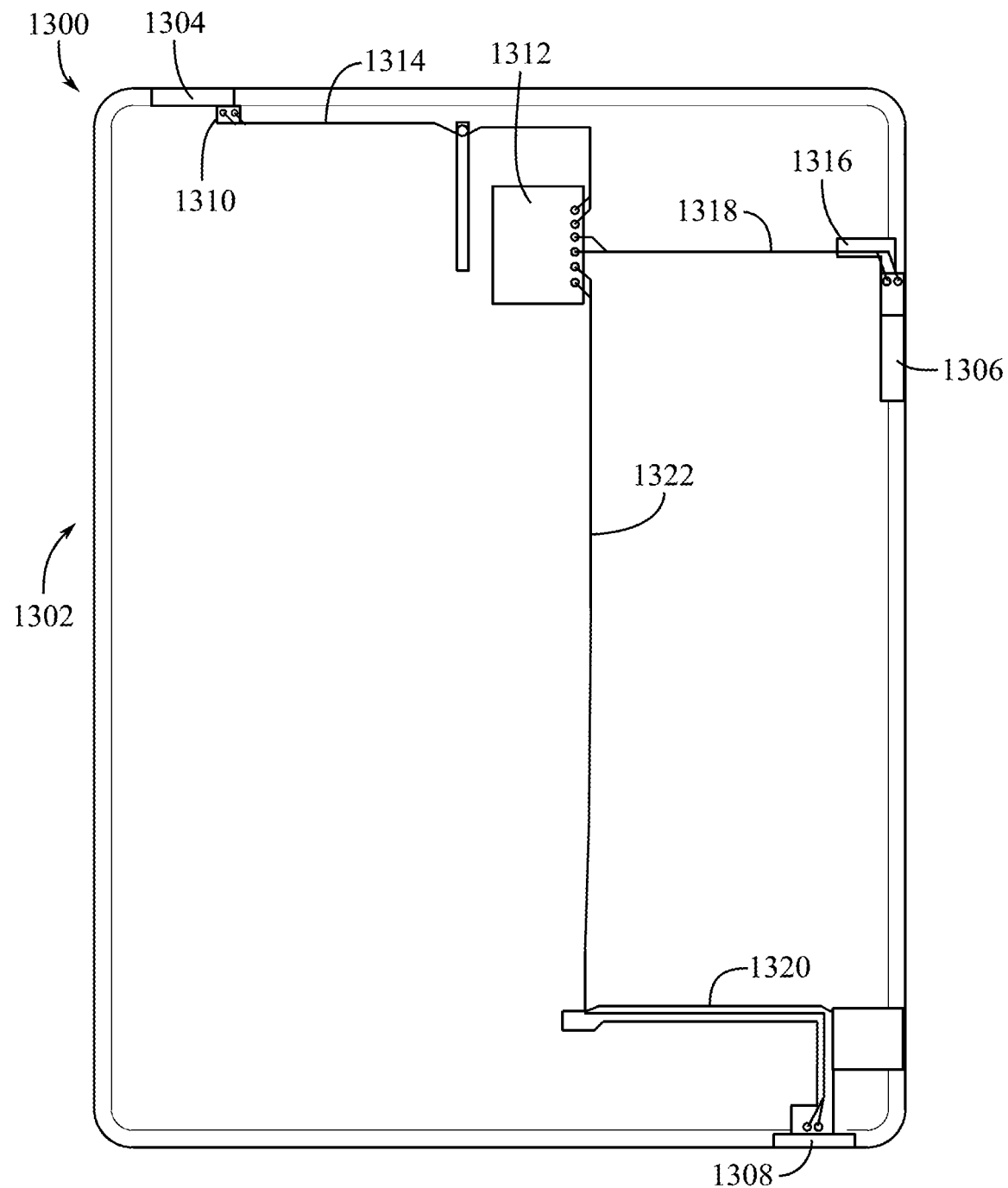
FIG. 13A shows a cross-sectional rear view of an electronic device.

FIG. 13A shows a cross-sectional rear view of an electronic device 1300 including am enclosure or housing 1302. The electronic device 1300 can be substantially similar to, and can include some or all of the features of the electronic devices 100, 200, 300, 400, 500, 800. In some examples, the electronic device 1300 can include antennas for communicating via the millimeter-wave spectrum. For example, the electronic device 1300 can include a first millimeter-wave antenna 1304, a second millimeter-wave antenna 1306, and a third millimeter-wave antenna 1308. Millimeter-wave antennas can be more directional and more susceptible to attenuation from occlusion than antennas for other spectra. For example, with respect to attenuation, if a user places his or her hand over a millimeter-wave antenna, communications through that antenna can suffer or be completely ceased. With respect to directionality, if the millimeter-wave antenna is pointed more than a certain angle away from a cell tower, the antenna can cease being able to effectively communicate with that cell tower. In order to mitigate these effects, the electronic device 1300 can include multiple millimeter-wave antennas (e.g., the first, second, and third millimeter-wave antennas 1304, 1306, 1308) strategically positioned to enable wireless communications in a number of different positions, locations, and orientations. In some examples, the first millimeter-wave antenna 1304 can be oriented within the housing 1302 as a rear-fired antenna. In other words, the first millimeter-wave antenna 1304 can send and receive electromagnetic signals primarily along a direction that is perpendicular to the rear surface of the device. For example, the first millimeter-wave antenna 1304 can send and receive electromagnetic signals through a RF transparent material or window formed within a back surface of the housing 1302. In some examples, the second millimeter-wave antenna 1306 can be oriented within the housing 1302 as a front-fired antenna. In other words, the second millimeter-wave antenna 1306 can send and receive electromagnetic signals primarily along a direction that is perpendicular to the front surface or cover glass (not shown) of the electronic device 1300. In some examples, the third millimeter-wave antenna 1308 can be oriented within the housing 1302 as a side-fired antenna. In other words, the third millimeter-wave antenna 1308 can send and receive electromagnetic signals primarily along a direction that is perpendicular to a side surface or side wall of the housing 1302 of the electronic device 1300. It will be understood that the directional millimeter-wave antennas need not be oriented directly at another antenna in order to communicate, but can tolerate slight misalignments (e.g., +/−15 degrees, +/−30 degrees, or another value).

In some examples, at least one of the first, second, and third millimeter-wave antennas 1304, 1306, 1308 include elements that are configured to communicate via a 5G wireless protocol. 5G communications may be achieved using various different communications protocols. For example, 5G communications may use a communications protocol that uses a frequency band below 6 GHz (also referred to as the sub-6 GHz spectrum). As another example, 5G communications may use a communications protocol that uses a frequency band above 24 GHz (also referred to as the millimeter-wave spectrum). Further, the particular frequency band of any given 5G implementation may differ from others. For example, different wireless communications providers may use different frequency bands in the millimeter-wave spectrum (e.g., one provider may implement a 5G communications network using frequencies around 28 GHz, while another may use frequencies around 39 GHz). The particular antenna group(s) (e.g., the first, second, and third millimeter-wave antennas 1304, 1306, 1308) implemented in the electronic device 1300 as described herein can be configured to allow communications via one or multiple of the frequency bands that implement 5G communications.

Each of the first, second, and third millimeter-wave antennas 1304, 1306, 1308 can be supplied one or more control signals, one or more power signals, one or more frequency signals, and a ground. For example, the first millimeter-wave antenna 1304 can be electrically coupled to a first flexible trace 1310. The first flexible trace 1310 can provide power signals, control signals, and frequency signals to the first millimeter-wave antenna 1304. The frequency signals (e.g., two intermediate frequency signals ranging from about 5

GHz to about 15 GHz) can be generated at an intermediate frequency source 1312 and carried to the first flexible trace 1310 by a first pair of coaxial cables 1314. For example, the frequency signals can be two intermediate frequency signals of about 10 GHz. The first flexible trace 1310 can be grounded, for example, by a fastener or other conductive communication with the housing 1302.

In some examples, the second millimeter-wave antenna 1306 can be electrically coupled to a second flexible trace 1316. The second flexible trace 1316 can provide power signals, control signals, and frequency signals to the second millimeter-wave antenna 1306. The frequency signals, for example, two intermediate frequency signals of about 10 GHz, can be generated at the intermediate frequency source 1312 and carried to the second flexible trace 1316 by a second pair of coaxial cables 1318. The second flexible trace 1316 can be grounded, for example, by a fastener or other conductive communication with the housing 1302.

In some examples, the third millimeter-wave antenna 1308 can be electrically coupled to a third flexible trace 1320. The third flexible trace 1320 can provide power signals, control signals, and frequency signals to the third millimeter-wave antenna 1308. The frequency signals, for example, two intermediate frequency signals of about 10 GHz, can be generated at the intermediate frequency source 1312 and carried to the third flexible trace 1320 by a third pair of coaxial cables 1322. The third flexible trace 1320 can be grounded, for example, by a fastener or other conductive communication with the housing 1302.

Signals having the relatively high frequencies required to satisfactorily operate a millimeter-wave antenna can suffer loss of signal strength as they are transferred from the signal source or generator (e.g., intermediate frequency source 1312) to a millimeter-wave antenna. Indeed, the greater distance between the signal source and the antenna, the greater the loss of signal strength over the distance. In some examples, the first, second, and third pairs of coaxial cables 1314, 1318, 1322 can each be shielded and sized to limit loss of the intermediate frequency signals as the signals are carried from the intermediate frequency source 1312 to each respective millimeter-wave antenna 1304, 1306, 1308. For example, a material, diameter, shielding, and routing of each of the pairs of coaxial cables 1314, 1318, 1322 can be chosen which limits or reduces the loss to signal strength per millimeter experienced by the intermediate frequency communicated through each coaxial cable.

Additionally, or alternatively, each pair of coaxial cables 1314, 1318, 1322 can be electrically coupled to the respective flexible traces near or adjacent their respective millimeter-wave antennas 1304, 1306, 1308 to mitigate the loss of signal strength that occurs when propagating the intermediate frequency (IF) signals through a flexible trace (e.g., flexible traces 1310, 1316, 1320). In other words, each of the pair of coaxial cables 1314, 1318, 1322 can be electrically coupled to a respective flexible trace at a location on the flexible trace that only requires the flexible trace to carry the IF signal a relatively short distance to the respective millimeter-wave antenna. For example, the location on the first flexible trace 1310 that a coaxial cable of the pair of coaxial cables 1314 is electrically coupled to the flexible trace 1310 can be about 15 mm, between about 15 mm and about 10 mm, between about 10 mm and about 5 mm, or less than the 5 mm from the millimeter-wave antenna 1304. Accordingly, the signal strength loss between the intermediate frequency source 1312 and each respective millimeter-wave antenna 1304, 1306, 1308 can be about 7 dB, between 15 dB and 10 dB, between 10 dB and 5 dB, or less than 5 dB.

In some examples, each pair of coaxial cables 1314, 1318, 1322 can have a respective length (e.g., span a distance between the intermediate frequency source 1312 and a respective flexible trace 1310, 1316, 1320) that is greater than a respective length within each of the flexible traces 1310, 1316, 1320 that the IF signal must propagate through to reach the antenna (e.g., millimeter-wave antenna 1304, 1306, 1308). For example, each coaxial cable of the first pair of coaxial cables 1314 can have a length that is at least 5 times greater than a length within the first flexible trace 1310 that the IF signal must propagate to reach the first millimeter-wave antenna 1304. In some examples, the length of each coaxial cable of the first pair of coaxial cables 1314 can be at least 10 times greater than the length within the first flexible trace 1310 that the IF signal must propagate to reach the first millimeter-wave antenna 1304. Additionally, or alternatively, each coaxial cable of the second pair of coaxial cables 1318 can have a length that is at least 5 times greater than a length within the second flexible trace 1316 that the IF signal must propagate to reach the second millimeter-wave antenna 1306. In some examples, the length of each coaxial cable of the second pair of coaxial cables 1318 can be at least 10 times greater than the length within the second flexible trace 1316 that the IF signal must propagate to reach the second millimeter-wave antenna 1306. Additionally, or alternatively, each coaxial cable of the third pair of coaxial cables 1322 can have a length that is at least 5 times greater than a length within the third flexible trace 1320 that the IF signal must propagate to reach the third millimeter-wave antenna 1308. In some examples, the length of each coaxial cable of the third pair of coaxial cables 1322 can be at least 10 times greater than the length within the third flexible trace 1320 that the IF signal must propagate to reach the third millimeter-wave antenna 1308.

Figure 13B:
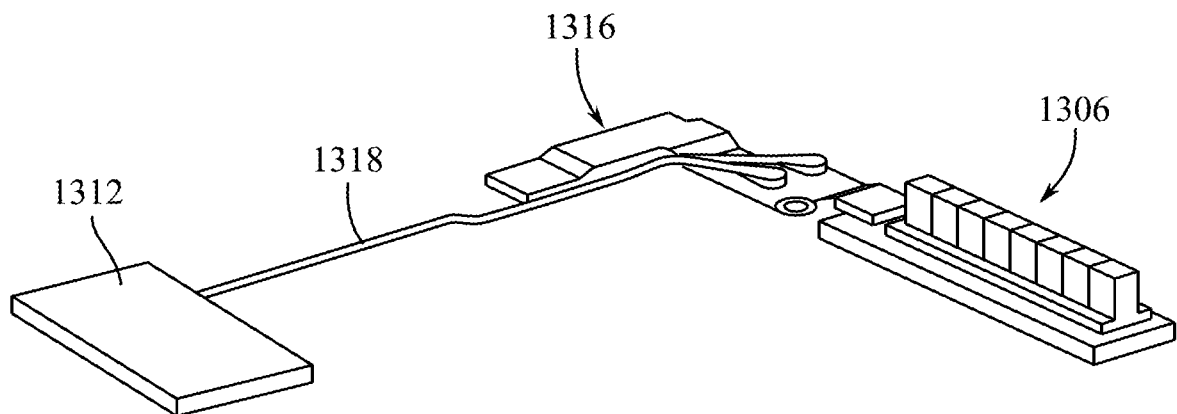
FIG. 13B shows a millimeter-wave antenna of the electronic device of FIG. 13A.

FIG. 13B shows the second millimeter-wave antenna 1306 of the electronic device 1300 electrically coupled to the intermediate frequency source 1312 through the second pair of coaxial cables 1318 and the second flexible trace 1316. In some examples, power signals, a grounding path, and a control signal can be supplied to the second millimeter-wave antenna 1306 through distinct electrical traces formed within the second flexible trace 1316. In some examples, the second flexible trace 1316 can induce more loss on the intermediate frequencies than the second pair of coaxial cables 1318. Consequently, the second pair of coaxial cables 1318 can electrically couple to the second flexible trace 1316 near the second millimeter-wave antenna 1306 to reduce a distance the intermediate frequencies are required to travel through the second flexible trace 1316.

Figure 13C:
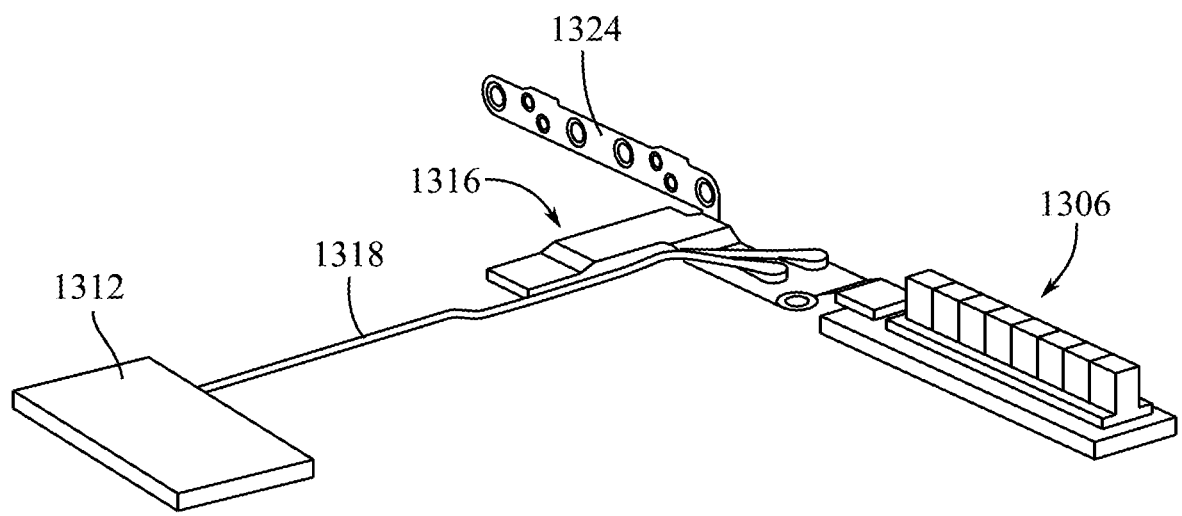
FIG. 13C shows a millimeter-wave antenna of the electronic device of FIG. 13A.

FIG. 13C shows the second millimeter-wave antenna 1306 of the electronic device 1300 electrically coupled to the intermediate frequency source 1312 through the second pair of coaxial cables 1318 and the second flexible trace 1316. In some examples, second flexible trace 1316 can additionally, or alternatively, be electrically coupled to another component of the electronic device 1300. For example, the second flexible trace 1316 can provide power and control signals to an input component 1324, such as, a button, sensor, switch, or other component capable of receiving an input from a user of the electronic device 1300.

Any number or variety of components in any of the configurations described herein can be included in the electronic device. The components can include any combination of the features described herein and can be arranged in any of the various configurations described herein. The structure and arrangement of components of an electronic device having a housing with structures described herein, and defining an internal volume, as well as the concepts regarding electrically grounding display modules, can apply not only to the specific examples discussed herein, but to any number of examples in any combination. Various examples of electronic devices including components, such as grounding elements and grounding layers, having various features in various arrangements are described below, with reference to FIGS. 14-16D.

Figure 14:
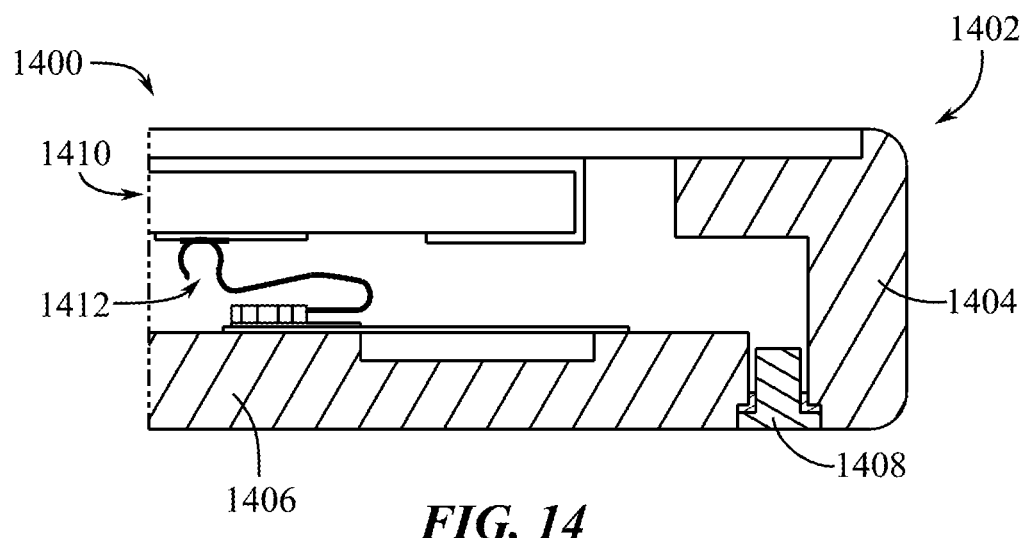
FIG. 14 shows a close-up cross-sectional side view of an electronic device.

FIG. 14 shows a close-up cross-sectional side view of an electronic device 1400 including a housing 1402. The electronic device 1400 can be substantially similar to, and can include some or all of the features of the electronic devices 100, 200, 300, 400, 500, 800, 1300. The housing 1402 can be substantially similar, and can include some or all of the features of the housing 102. For example, the housing 1402 can include a frame 1404 and a backplate 1406. In some examples, the housing 1402 can include a dielectric 1408 disposed between at least a portion of the frame 1404 and backplate 1406. The dielectric 1408 can electrically isolate one or more portions of the housing 1402 to enable wireless communication via one or more antennas. For example, the dielectric 1408 can be formed from or include a substantially non-conductive material or electrically insulating material such that a portion of the housing 1402 (e.g., a portion of the frame 1404) can be electrically isolated to act as an antenna for the electronic device 1400.

The electronic device 1400 can include a display module 1410 at least partially disposed within the housing 1402. In some examples, the display module 1410 can be electrically grounded to the backplate 1406 by a grounding element 1412 biased to contact a lower or bottom surface of the display module 1410. The grounding element 1412 can be affixed to the backplate 1406 or the frame 1404 such that current induced on the display module 1410 by an antenna (not shown) can ground from the display module 1410 to the backplate 1406 or the frame 1404. In some examples, a current density at the point of contact between the display module 1410 and the grounding element 1412 can generate noise due to passive intermodulation (PIM) and/or another effect of the relatively high current density at the point of contact between the display module 1410 and the grounding element 1412. This noise can negatively impact the operations of one or more antennas of the electronic device 1400. To reduce or eliminate the noise causing the negative impact, a conductive layer 1414 can be disposed between the display module 1410 and the grounding element 1412.

In some examples, the conductive layer 1414 can include metal, such as, copper, gold, silver, nickel, a combination thereof, or another conductive metal. For example, the conductive layer 1414 can include a foil or woven fabric that has been plated in gold. A more robust material (e.g., a thicker material, more durable material, etc.) can be beneficial to withstand the degrading effects of the current density and force placed on the conductive layer 1414 by the grounding element 1412. The conductive layer 1414 can be adhered or otherwise affixed to the display module 1410. The conductive layer 1414 can be affixed to at least a portion of a surface of the display module 1410 facing the backplate 1406 or frame 1404.

Figure 15A:
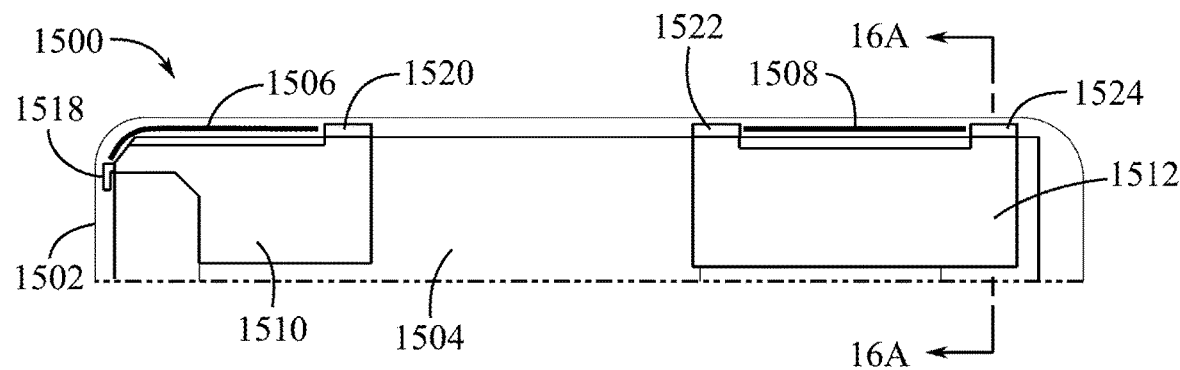
FIG. 15A shows a partial cross-sectional rear view of an electronic device.

FIG. 15A shows a partial cross-sectional rear view of an electronic device 1500 including a cover glass 1502 and a display module 1504 disposed adjacent the cover glass 1502. The electronic device 1500 can be substantially similar to, and can include some or all of the features of the electronic devices 100, 200, 300, 400, 500, 800, 1300, 1400. When one or more antennas 1506, 1508 are generating electromagnetic waves (e.g., transmitting), the electromagnetic waves can induce a current on the display module 1504 that can negatively impact the performance of the one or more antennas 1506, 1508. In some examples, a first grounding layer 1510 can be disposed on the display module 1504 near the first antenna 1506. Additionally, or alternatively, a second grounding layer 1512 can be disposed on the display module 1504 near the second antenna 1508. The first and second grounding layers 1510, 1512 can be at least partially disposed over a flexible electrical trace in some examples, such that the flexible electrical trace is disposed between a rear surface 1514 of the display module 1504 and the first and/or second grounding layers 1510, 1512. In other examples, one or more flexible electrical traces can be disposed over one or both of the grounding layers 1510, 1512, such that at least one of the grounding layers 1510, 512 of the first and second grounding layers 1510, 1512 are disposed between the flexible trace and the rear surface 1514. The first and second grounding layers 1510, 1512 can include conductive material which electrically grounds the display module 1504 to a housing or enclosure (not shown) to reduce or eliminate current induced on the display module 1504 by operation of the first and/or second antenna 1506, 1508. For example, the first and second grounding layers 1510, 1512 can be a conductive tape adhered to the display module 1504.

Figure 15B:
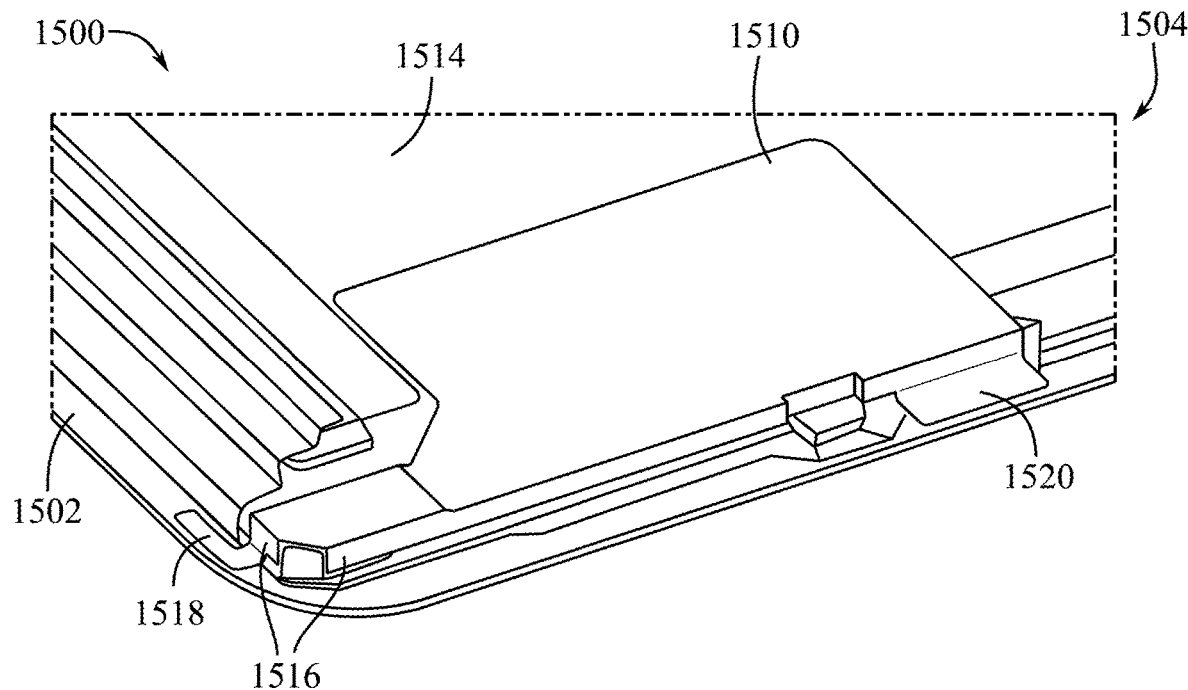
FIG. 15B shows a close-up perspective view of the electronic device of FIG. 15A.

In some examples, the first grounding layer 1510 be at least partially disposed over multiple surfaces of the display module 1504. For example, as shown in FIG. 15B, the first grounding layer 1510 can at least partially cover a rear surface 1514 and one or more side surfaces 1516 of the display module 1504. Additionally, or alternatively, the second grounding layer 1512 can at least partially cover the rear surface 1514 and the one or more side surfaces 1516 of the display module 1504. In some examples, at least one of the rear surface 1514 or the side surfaces 1516 can be orthogonal or nonparallel to one another. For example, the rear surface 1514 can be perpendicular or orthogonal to one or both of the side surfaces 1516. In some examples, each of the side surfaces 1516 can be perpendicular or orthogonal to one another. One or more of the side surfaces 1516 overlaid by the first and/or second grounding layers 1510, 1512 can face a portion of the first and/or second antennas 1506, 1508.

In some examples, the first grounding layer 1510 can form a first tab 1518 that is adhered or otherwise affixed to the housing (not shown). For example, the first tab 1518 can be disposed between the housing and the cover glass 1502. The first grounding layer 1510 can form additional tabs, such as, a second tab 1520 that is adhered or otherwise affixed to the housing (not shown). For example, the second tab 1520 can be disposed between the housing and the cover glass 1502. The first and second tabs 1518, 1520 can be disposed on opposite ends of the first antenna 1506 to contact the housing at two distinct locations on the housing. In other words, the first and second tabs 1518, 1520 can contact the housing (not shown) at respective locations which are spaced apart or otherwise separated by a distance. In some examples, the distance can be greater than or equal to the length of the first antenna 1506.

In some examples, the second grounding layer 1512 can form a third tab 1522 that is adhered or otherwise affixed to the housing (not shown). For example, the third tab 1522 can be disposed between the housing and the cover glass 1502. The second grounding layer 1512 can form additional tabs, such as, a fourth tab 1524 that is adhered or otherwise affixed to the housing (not shown). For example, the fourth tab 1524 can be disposed between the housing and the cover glass 1502. The third and fourth tabs 1522, 1524 can be disposed on opposite ends of the second antenna 1508 to contact the housing at two distinct locations on the housing. In other words, the third and fourth tabs 1522, 1524 can contact the housing (not shown) at respective locations which are spaced apart or otherwise separated by a distance. In some examples, the distance can be greater than or equal to the length of the second antenna 1508.

Figure 16A:
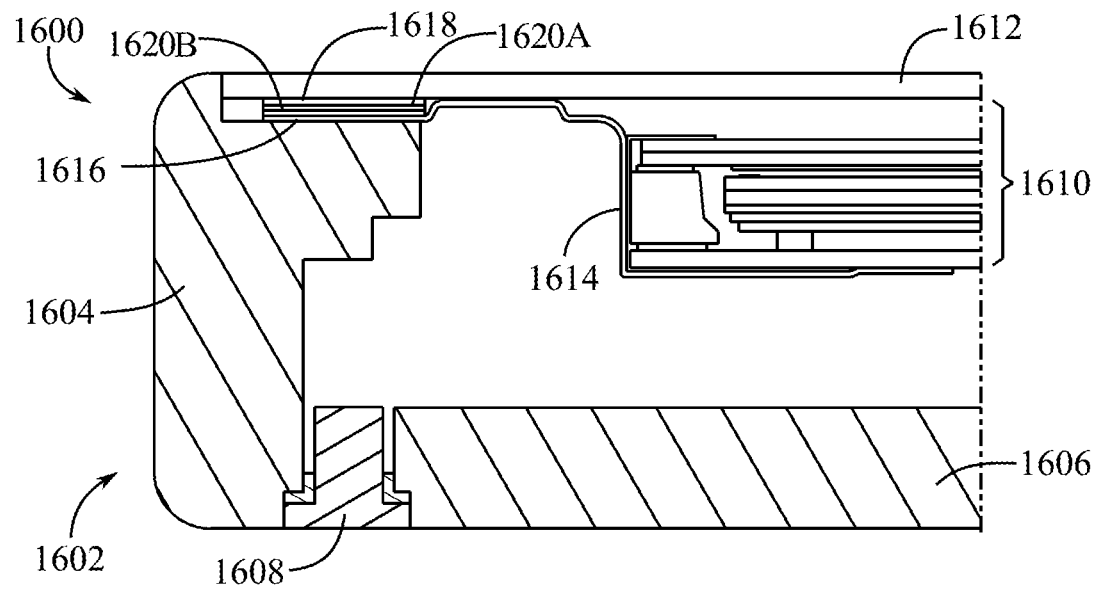
FIG. 16A shows a close-up side cross-sectional view of an electronic device.

FIG. 16A shows a close-up cross-sectional side view of an electronic device 1600 including a housing 1602. The housing 1602 can be substantially similar, and can include some or all of the features of the housings 102, 1402. For example, the housing 1602 can include a frame 1604 and a backplate 1606. In some examples, the housing 1602 can include a dielectric 1608 disposed between at least a portion of the frame 1604 and backplate 1606. The dielectric 1608 can electrically isolate one or more portions of the housing 1602 to enable wireless communication via one or more antennas (not shown). For example, the dielectric 1608 can be formed from or include a substantially non-conductive material or electrically insulating material such that a portion of the housing 1602 (e.g., a portion of the frame 1604) can be electrically isolated to act as an antenna for the electronic device 1600.

The electronic device 1600 can include a display module 1610 at least partially disposed within the housing 1602 and adjacent a cover glass 1612. In some examples, the display module 1610 can be electrically grounded to the backplate 1606 by one or more grounding layers 1614. The one or more grounding layers 1614 can be substantially similar to, and can include some or all of the features of the grounding layers 1510, 1512. For example, the grounding layer 1614 can include conductive materials which electrically grounds the display module 1610 to the housing 1602 or enclosure to reduce or eliminate current induced on the display module 1610 by operation of a first and/or second antenna (not shown). In some examples, the grounding layer 1614 can be a conductive tape adhered to one or more surfaces defined by the display module 1610.

Figure 16B:
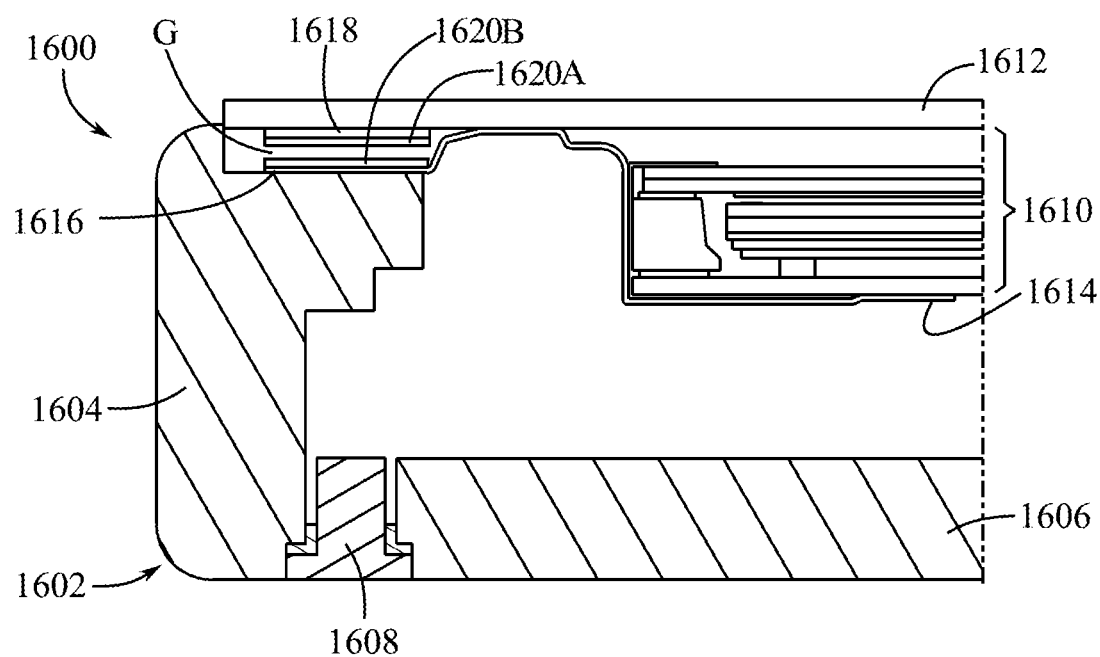
FIG. 16B shows a close-up side cross-sectional view of an electronic device.
Figure 16C:
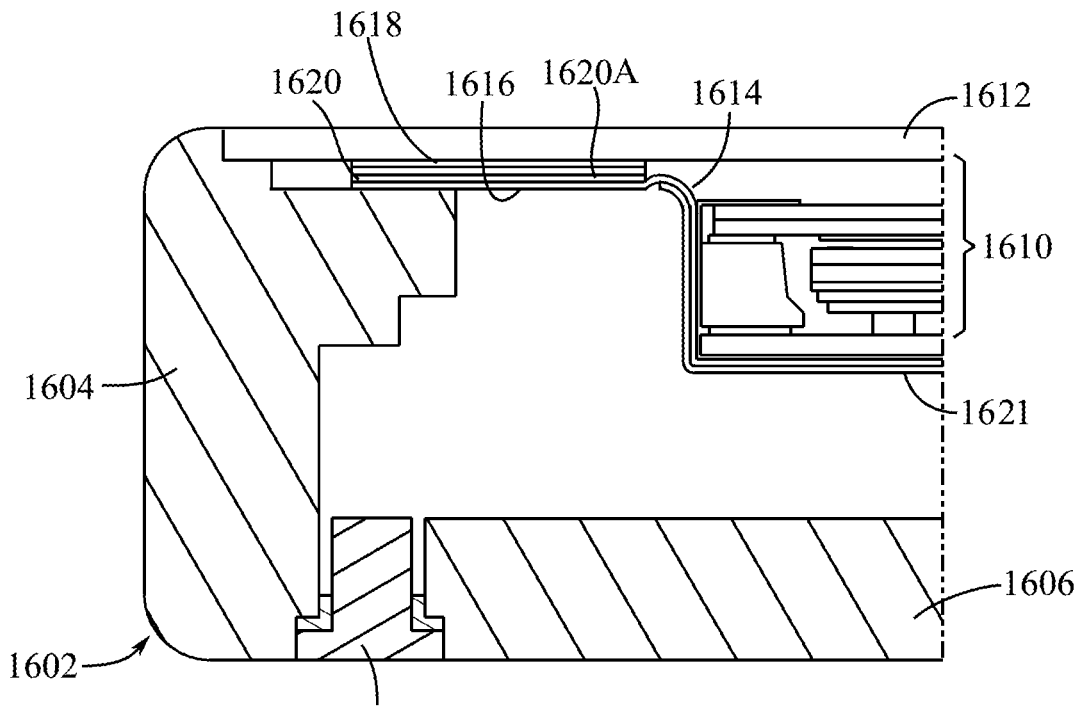
FIG. 16C shows a close-up side cross-sectional view of an electronic device.

The grounding layer 1614 can include a tab 1616 adhered or affixed to the housing 1602 (e.g., the frame 1604). In some examples, the tab 1616 can be disposed between the frame 1604 and the cover glass 1612. When the tab 1616 is directly or indirectly affixed to the cover glass (e.g., by a pressure sensitive adhesive (PSA) tape 1618), a drop event can cause the cover glass 1612 to shift away from the frame 1604 and tear or pull the tab 1616 away from the frame 1604 to jeopardize the electrical ground established by the tab 1616 and the frame 1604. In some examples, as shown in FIG. 16B, one or more intermediate materials or separation layers 1620A and/or 1620B can be applied between the tab 1616 and the PSA tape 1618. The first separation layer 1620A can be adhered to the PSA tape 1618 but otherwise untethered to the second separation layer 1620B. The second separation layer 1620B can be adhered to the tab 1616 such that the tab 1616 remains affixed to the frame 1604 when the cover glass 1612 shifts away from the frame 1604. In other words, the first and second separation layers 1620A, 1620B can form a gap G when the cover glass 1612 shifts relative to the frame 1604. While the separation layers 1620A, 1620B are illustrated as substantially disposed between the PSA tape 1618 and the tab 1616, the separation layers 1620A, 1620B can extend further along the tab 1616. For example, as shown in FIG. 16C, in some examples, each of the separation layers 1620A, 1620B can extend along the tab 1616 toward the display module 1610 and limit contact between the tab 1616 and the cover glass 1612. In some examples, a coating or cover layer 1621 can be disposed over the grounding layer 1614. While the examples shown in FIGS. 16A, 16B, and 16C include two separation layers (e.g., first and second separation layers 1620A, 1620B), other examples can include more (e.g., three or more) or fewer (e.g., a single separation layer) separation layers.

Figure 16D:
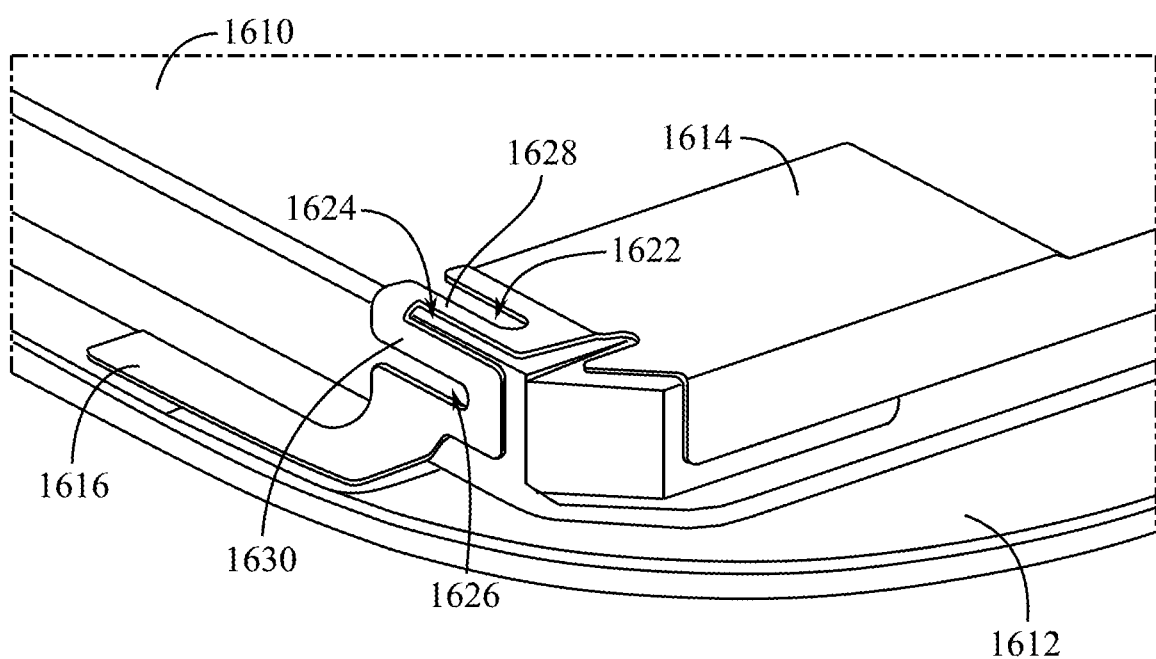
FIG. 16D shows a close-up perspective view of an electronic device.

FIG. 16D shows a close-up perspective view of the electronic device 1600 including the grounding layer 1614. In some examples, the grounding layer 1614 can include features which allow the grounding layer 1614 to move or flex relative to the display module 1610 and/or the housing 1602. For example, the grounding layer 1614 can form one or more reliefs that enable the tab 1616 to remain affixed to the frame 1604 while the display module 1610 shifts or moves. In some examples, the grounding layer 1614 can form a first relief 1622, a second relief 1624, and a third relief 1626. A first thinned section 1628 of the grounding layer 1614 can be formed between the first and second reliefs 1622, 1624. A second thinned section 1630 of the grounding layer 1614 can be formed between the second and third reliefs 1624, 1626. The first and second thinned sections 1628, 1630 can move relative to the display module 1610 to enable the display module 1610 to move relative to the frame 1604 while maintaining contact between the tab 1616 and the frame 1604 (i.e., without jeopardizing the electrical ground provided by the contact between the tab 1616 and the frame 1604). In other words, at least one of the first, second, and third reliefs 1622, 1624, 1626 can deform to allow the display module 1610 to move relative to the frame 1604 while maintaining contact between the tab 1616 and the frame.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device, comprising:
    a housing;
    a processor positioned within the housing;
    an electronic component positioned at least partially within the housing;
    a flexible trace having a first end electrically coupled to the processor, the flexible trace having a second end electrically coupled to the electronic component; and
    a foam contacting the flexible trace between the first end and the second end, the foam disposed between the flexible trace and the electronic component, the foam exerting a force on the flexible trace;
    wherein a length of the flexible trace is greater than a distance between the first end and the second end.

2. The electronic device of claim 1, wherein the foam comprises a compressible material.

3. The electronic device of claim 1, wherein the foam places the flexible trace under tension.

4. The electronic device of claim 1, wherein:
    the first end electrically couples to a first electrical contact of the processor;
    the second end electrically couples to a second electrical contact of the electronic component.

5. The electronic device of claim 1, wherein the foam is positioned between the flexible trace and a display module.

6. The electronic device of claim 1, wherein the electronic component comprises a display module.

7. An electronic device, comprising:
    a housing;
    a display module coupled to the housing, the display module comprising:
        a support structure defining a first inlet and a second inlet, the support structure including an intermediate wall separating the first inlet from the second inlet;
        an optical film at least partially disposed within the support structure, a first portion of the optical film disposed within the first inlet, and a second portion of the optical film disposed within the second inlet;
        a printed circuit board; and
        a transparent layer;
        wherein the optical film is disposed between the transparent layer and the printed circuit board.

8. The electronic device of claim 7, wherein the optical film is a first optical film and the display module further comprises a second optical film, the second optical film at least partially disposed within only one of either the first inlet or the second inlet.

9. The electronic device of claim 7, wherein the first portion of the optical film is adhered within the first inlet by a pressure sensitive adhesive tape.

10. The electronic device of claim 7, wherein:
the optical film comprises multiple layers of optical film;
each of the multiple layers of optical film are staggered relative to one another; and
the support structure forms a base that extends toward the multiple layers of optical film.

11. The electronic device of claim 7, wherein:
the first inlet has a first thickness; and
the second inlet has a second thickness different from the first thickness.

12. The electronic device of claim 7, wherein:
the first inlet has a first depth; and
the second inlet has a second depth different from the first depth.

13. The electronic device of claim 7, wherein the support structure defines an edge having at least one section that is chamfered, rounded, stepped, or recessed.

14. The electronic device of claim 7, wherein the display module further comprises a light blocking material overlaying a slot defined by the support structure.

15. The electronic device of claim 7, wherein:
the display module further comprises a conductive layer adhered to the display module and electrically grounding the display module to the housing.

16. The electronic device of claim 7, wherein the display module further comprises:
a conductive layer adhered to the display module and electrically grounding the display module to the housing;
a semi-rigid member disposed between the conductive layer and a pressure sensitive adhesive; and
an elastic layer disposed between the pressure sensitive adhesive and a barrier layer.

17. An electronic device, comprising:
a housing;
a display module, comprising:
a support structure;
an optical film at least partially disposed within the support structure;
a printed circuit board coupled to the support structure, the printed circuit board including a first electronic component and a second electronic component; and
a spacer disposed between the optical film and the printed circuit board, the spacer affixed to the printed circuit board between the first electronic component and the second electronic component; and
a processor communicatively coupled to the display module.

18. The electronic device of claim 17, wherein:
the processor is communicatively coupled to the display by a flexible trace; and
the flexible trace is biased to route around the display module by a stiffener.

19. The electronic device of claim 17, wherein the spacer has a thickness of at least 5 mm.

20. The electronic device of claim 17, wherein the spacer comprises a polymer.

* * * * *